(12) United States Patent  
Ohri

(10) Patent No.: US 8,692,303 B2
(45) Date of Patent: Apr. 8, 2014

(54) SOLID-STATE IMAGING DEVICE, ELECTRONIC DEVICE, AND MANUFACTURING METHOD FOR SOLID-STATE IMAGING DEVICE

(75) Inventor: Hiroyuki Ohri, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/533,420

(22) Filed: Jun. 26, 2012

(65) Prior Publication Data

US 2013/0009224 A1    Jan. 10, 2013

(30) Foreign Application Priority Data

Jul. 5, 2011  (JP) ................................. 2011-148882

(51) Int. Cl.
*H01L 31/0224* (2006.01)
(52) U.S. Cl.
USPC .................................. 257/292; 257/E31.124
(58) Field of Classification Search
USPC .......................................... 257/292, E31.124
See application file for complete search history.

(56) References Cited

U.S. PATENT DOCUMENTS 7,928,486 B2 *  4/2011  Yuzurihara et al. ........... 257/292

FOREIGN PATENT DOCUMENTS

JP    2003-031785    1/2003
JP    2008-103668    5/2008

* cited by examiner

*Primary Examiner* — Matthew W Such
*Assistant Examiner* — Monica D Harrison
(74) *Attorney, Agent, or Firm* — Sheridan Ross P.C.

(57) ABSTRACT

In a manufacturing method for a solid-state imaging device, a photoelectric conversion portion including a first impurity layer whose carrier polarity is a first conductivity type is formed within a substrate, a second impurity layer, whose carrier polarity is a second conductivity type opposite to the first conductivity type, is formed on a surface of the first impurity layer so as to be in contact with the surface located on one surface side of the substrate, a third impurity layer, whose carrier polarity is the first conductivity type, is formed on the second impurity layer so as to be in contact therewith, a gate electrode is formed above the third impurity layer so as to cover the third impurity layer, and an impurity region portion, whose carrier polarity is the first conductivity type, is formed within the substrate so as to be connected to the third impurity layer.

9 Claims, 11 Drawing Sheets

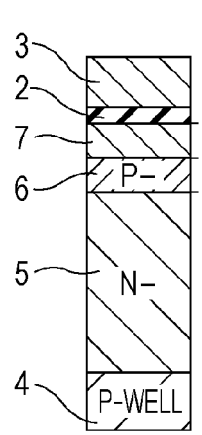
FIG. 5A
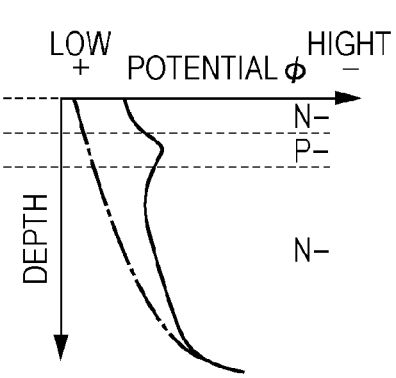
FIG. 5B
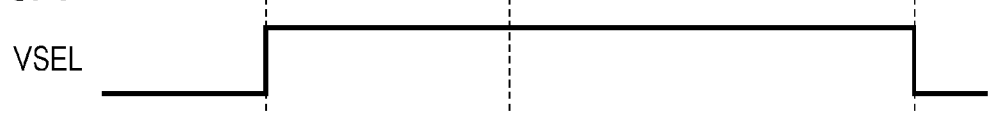
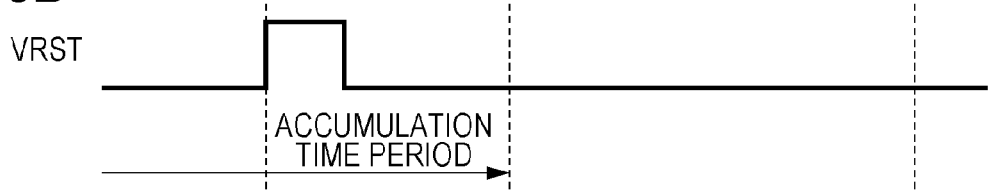
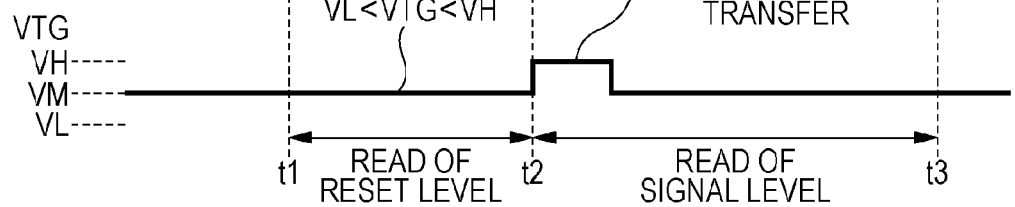

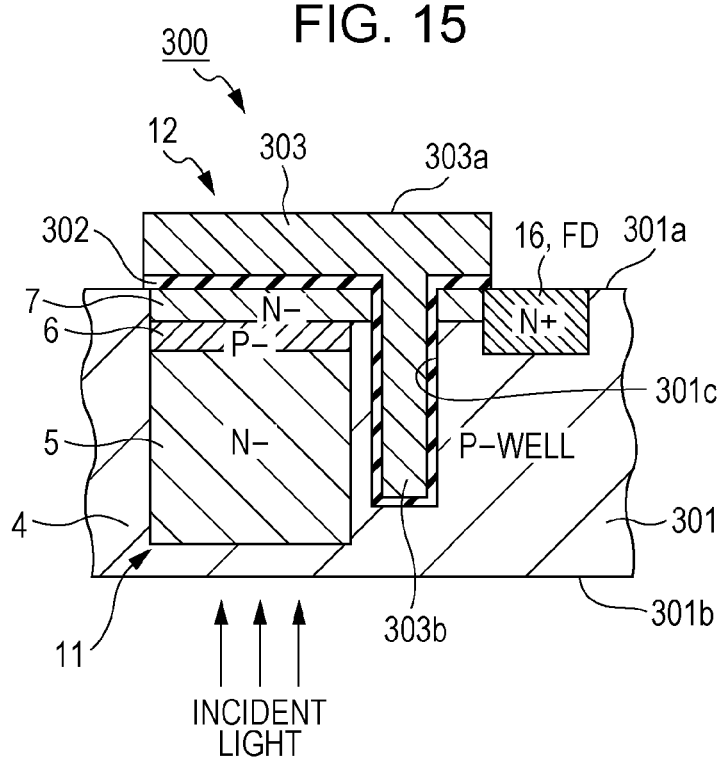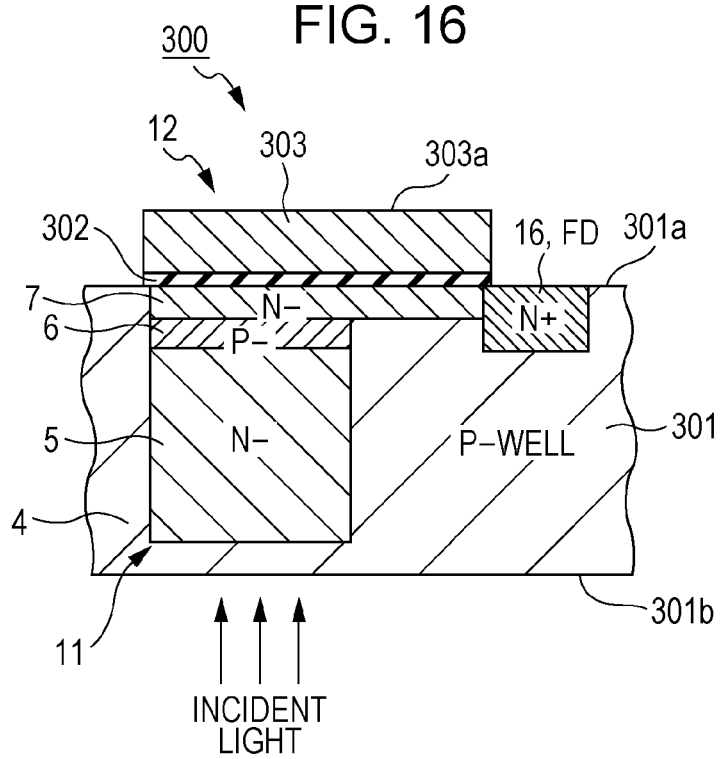

SOLID-STATE IMAGING DEVICE, ELECTRONIC DEVICE, AND MANUFACTURING METHOD FOR SOLID-STATE IMAGING DEVICE

BACKGROUND

An embodiment of the present disclosure relates to a solid-state imaging device, an electronic device equipped therewith, and a manufacturing method for the solid-state imaging device.

Previously, as a solid-state imaging device, there have existed active pixel sensors (APSs) each of which is equipped with an amplifying element with respect to each pixel. In recent years, among them, complementary MOS (CMOS) image sensors where signal charge accumulated in a photodiode serving as a photoelectric conversion element is read through a metal-oxide-semiconductor (MOS) transistor have been used for various purposes.

The CMOS image sensor includes a substrate in which a photodiode subjecting incident light to photoelectric conversion is formed and a wiring layer formed on the substrate. In addition, at present, front-side illumination type CMOS image sensors are widely used where a photodiode is irradiated with light from a substrate surface on the wiring layer side of the substrate.

In addition, recently, so as to improve the sensitivity of a photodiode, back-side illumination type CMOS image sensors have also been proposed where a photodiode is irradiated with light from a substrate surface (back surface) on a side opposite to the wiring layer side of a substrate. An example of such a technique has been disclosed in Japanese Unexamined Patent Application Publication No. 2003-31785 or Japanese Unexamined Patent Application Publication No. 2008-103668.

FIG. 19 illustrates a schematic cross-sectional view in the vicinity of a photodiode in the back-side illumination type CMOS image sensor proposed in Japanese Unexamined Patent Application Publication No. 2003-31785. A photodiode 601 is formed within a silicon layer 600. In addition, the photodiode 601 includes an N− region 601a, an N+ region 601b accumulating therein signal charge (electrons), formed on the N− region 601a, and a P+ layer 601c formed on the N+ region 601b. In addition, a shallow P+ layer 602 is formed on a surface on the light incidence side of the photodiode 601, and a deep P well 603 to be a pixel separation layer is formed in the side portion of the photodiode 601.

Namely, the back-side illumination type CMOS image sensor in Japanese Unexamined Patent Application Publication No. 2003-31785 has a structure in which the N type impurity region of the photodiode 601 is surrounded by a P type impurity layer. In particular, on the substrate surface side of the N type impurity region of the photodiode 601, the high impurity concentrated P+ layer 601c is formed, and the photodiode 601 in Japanese Unexamined Patent Application Publication No. 2003-31785 has a hole accumulated diode (HAD) type structure suppressing the occurrence of a dark current due to surface generation recombination.

In addition, in the back-side illumination type CMOS image sensor in Japanese Unexamined Patent Application Publication No. 2003-31785, the signal charge, subjected to photoelectric conversion in the photodiode 601 and accumulated in the N+ region 601b, is transferred by a transfer transistor 604 to a floating diffusion region 605 in an N+ type region.

In addition, here, for comparison, FIG. 20 illustrates a schematic cross-sectional view in the vicinity of a photodiode in a front-side illumination type CMOS image sensor described in Japanese Unexamined Patent Application Publication No. 2003-31785. A pixel portion 700 in the front-side illumination type CMOS image sensor includes an N type silicon substrate 701, a wiring layer 702 formed on the light incidence side of the N type silicon substrate 701, and a passivation film 703 formed on the light incidence side of the wiring layer 702. In addition, in the vicinity of a surface on the light incidence side of the N type silicon substrate 701, a P well region 704 is formed, and a photodiode 705 is formed so as to be embedded in the surface of the P well region 704. In addition, while not illustrated in FIG. 20, the N type silicon substrate 701 is connected to an applying terminal for a power source voltage Vdd, for example.

In the front-side illumination type CMOS image sensor illustrated in FIG. 20, in the bottom portion of an N type layer, in which the photodiode 705 is formed, the P well region 704 is formed that is to be a potential barrier for electrons generated in the photodiode 705. In addition, the potential barrier of the P well region 704 is set so as to be lower than the potential barrier of an element isolation portion (not illustrated) or a transfer gate (TG). In this case, in a direction from the photodiode 705 to the N type silicon substrate 701, an overflow path is formed that prevents electrons overflowing from the photodiode 705 (hereinafter, referred to as surplus electrons) from entering an adjacent pixel when high-intensity light is radiated. Namely, in the front-side illumination type CMOS image sensor illustrated in FIG. 20, the surplus electrons of the photodiode 705, which has occurred at the time of receiving light, is discharged across the potential barrier of the P well region 704 to the N type silicon substrate 701 connected to the applying terminal for the power source voltage Vdd or the like.

On the other hand, in the back-side illumination type CMOS image sensor illustrated in FIG. 19, since the back surface side of a substrate is subjected to light, the back surface side of the substrate is polished (thin-walled) owing to chemical mechanical polishing (CMP) processing until the thickness of the substrate reaches about 10 μm. Therefore, in the back-side illumination type CMOS image sensor, it is difficult to provide an N type substrate region in a region on the light incidence side of the photodiode 601 in the same way as the front-side illumination type CMOS image sensor illustrated in FIG. 20.

Namely, in the back-side illumination type CMOS image sensor, it is difficult to discharge the surplus electrons of the photodiode 601 to an N type substrate in the same way as in the front-side illumination type CMOS image sensor. As a result, in the back-side illumination type CMOS image sensor, when electrons, which have been generated owing to photoelectric conversion at the time of receiving light, exceed a predetermined amount of electrons capable of being accumulated in the photodiode 601, surplus electrons flow into the photodiode of an adjacent pixel. In this case, for example, a problem occurs where blooming, color mixture, or the like occurs.

Previously, so as to solve the above-mentioned problem, there has been proposed a technique where, in a back-side illumination type solid-state imaging device, a contact is formed in the upper portion of a photodiode and the surplus electrons of the photodiode are discharged to the outside of a pixel through the contact. An example of such a technique has been disclosed in Japanese Unexamined Patent Application Publication No. 2008-103668.

SUMMARY

As described above, previously, various techniques have been proposed that are used for discharging the surplus electrons of a photodiode to the outside of a pixel in a solid-state imaging device. However, in this technology field, a technique is desired to be developed that is used for more reliably discharging the surplus electrons (surplus electric charge) of a photodiode and further suppressing the occurrence of blooming, color mixture, or the like, for example.

According to an embodiment of the present disclosure, there are provided a solid-state imaging device, an electronic device equipped therewith, and a manufacturing method for the solid-state imaging device. It is desirable that such a solid-state imaging device is capable of further suppressing the occurrence of blooming, color mixture, or the like, for example.

A solid-state imaging device according to an embodiment of the present disclosure includes a substrate, a photoelectric conversion portion, an impurity region portion, a second impurity layer, a third impurity layer, a gate electrode, and the configurations and the functions of the individual portions are as follows. The photoelectric conversion portion is provided within the substrate, includes a first impurity layer whose carrier polarity is a first conductivity type, and photoelectric-converts incident light into signal charge. The impurity region portion is provided within the substrate, and the carrier polarity of the impurity region portion is the first conductivity type. The second impurity layer is formed on the surface of the first impurity layer so as to be in contact with the surface of the first impurity layer, which is located on one surface side of the substrate, and the carrier polarity of the second impurity layer is a second conductivity type opposite to the first conductivity type. The third impurity layer is formed on the second impurity layer so as to be in contact therewith and connected to the impurity region portion, and the carrier polarity of the third impurity layer is the first conductivity type. In addition, the gate electrode is formed above the third impurity layer so as to cover the third impurity layer.

In addition, an electronic device according to an embodiment of the present disclosure includes the above-mentioned solid-state imaging device and a signal processing circuit configured to perform predetermined processing on an output signal from the solid-state imaging device.

Furthermore, a manufacturing method for a solid-state imaging device according to an embodiment of the present disclosure is performed according to the following procedures. First, within a substrate, a photoelectric conversion portion is formed that includes a first impurity layer whose carrier polarity is a first conductivity type and photoelectric-converting incident light into signal charge. Next, a second impurity layer, whose carrier polarity is a second conductivity type opposite to the first conductivity type, is formed on a surface of the first impurity layer so as to be in contact with the surface of the first impurity layer, which is located on one surface side of the substrate. Next, a third impurity layer, whose carrier polarity is the first conductivity type, is formed on the second impurity layer so as to be in contact therewith. Next, a gate electrode is formed above the third impurity layer so as to cover the third impurity layer. In addition, an impurity region portion, whose carrier polarity is the first conductivity type, is formed within the substrate so as to be connected to the third impurity layer.

As described above, in the solid-state imaging device according to an embodiment of the present disclosure, on or above the photoelectric conversion portion including the first impurity layer whose carrier polarity is the first conductivity type, the second impurity layer whose carrier polarity is the second conductivity type and the third impurity layer whose carrier polarity is the first conductivity type are formed in this order. Furthermore, in the solid-state imaging device according to an embodiment of the present disclosure, the third impurity layer is connected to the impurity region portion, and the gate electrode is formed so as to cover the third impurity layer.

In the solid-state imaging device having such a configuration as described above, in a direction (the thickness direction of the substrate) headed from the photoelectric conversion portion to the third impurity layer through the second impurity layer, an overflow path may be formed that is used for surplus electric charge overflowing in the photoelectric conversion portion during a photoelectric conversion time period. In addition, the surplus electric charge flowing into the third impurity layer is discharged to the impurity region portion connected to the third impurity layer.

As described above, in the solid-state imaging device according to an embodiment of the present disclosure, it may be possible to reliably discharge the surplus electric charge, which overflows in the photoelectric conversion portion during the photoelectric conversion, to the outside of a pixel through the second impurity layer, the third impurity layer, and the impurity region portion. Therefore, according to an embodiment of the present disclosure, it may be possible to further suppress the occurrence of blooming, color mixture, or the like, for example.

BRIEF DESCRIPTION OF THE DRAWINGS

FIGS. 5A and 5B are diagrams for explaining a principle of an overflow operation in the solid-state imaging device of the first embodiment;

FIGS. 6A to 6C are diagrams illustrating a time chart at the time of the overflow operation in the solid-state imaging device of the first embodiment;

FIG. 15 is a schematic configuration cross-sectional view in the vicinity of the photodiode in the solid-state imaging device according to the third embodiment;

FIG. 16 is a schematic configuration cross-sectional view in the vicinity of the photodiode in the solid-state imaging device according to the third embodiment;

DETAILED DESCRIPTION OF EMBODIMENTS

Hereinafter, an example of a solid-state imaging device according to an embodiment of the present disclosure will be described with reference to drawings in the following order. In this regard, however, an embodiment of the present disclosure is not limited to the following example.

1. First Embodiment: Example of Basic Configuration
2. Second Embodiment: Example of Configuration where Work Function of Transfer Gate Is Adjusted
3. Third Embodiment: Example where Transfer Gate Is Configured Using Vertical Transfer Gate
4. Fourth Embodiment: Example of Configuration where Overflow Drain Is Provided Separately
5. Various Examples of Modification 1. First Embodiment Whole Configuration of Solid-State Imaging Device Before the inner structure of a unit pixel in a solid-state imaging device according to a first embodiment of the present disclosure is described, the whole configuration of the solid-state imaging device will be described with reference to drawings.

(1) Configuration of Solid-State Imaging Device

Figure 1:
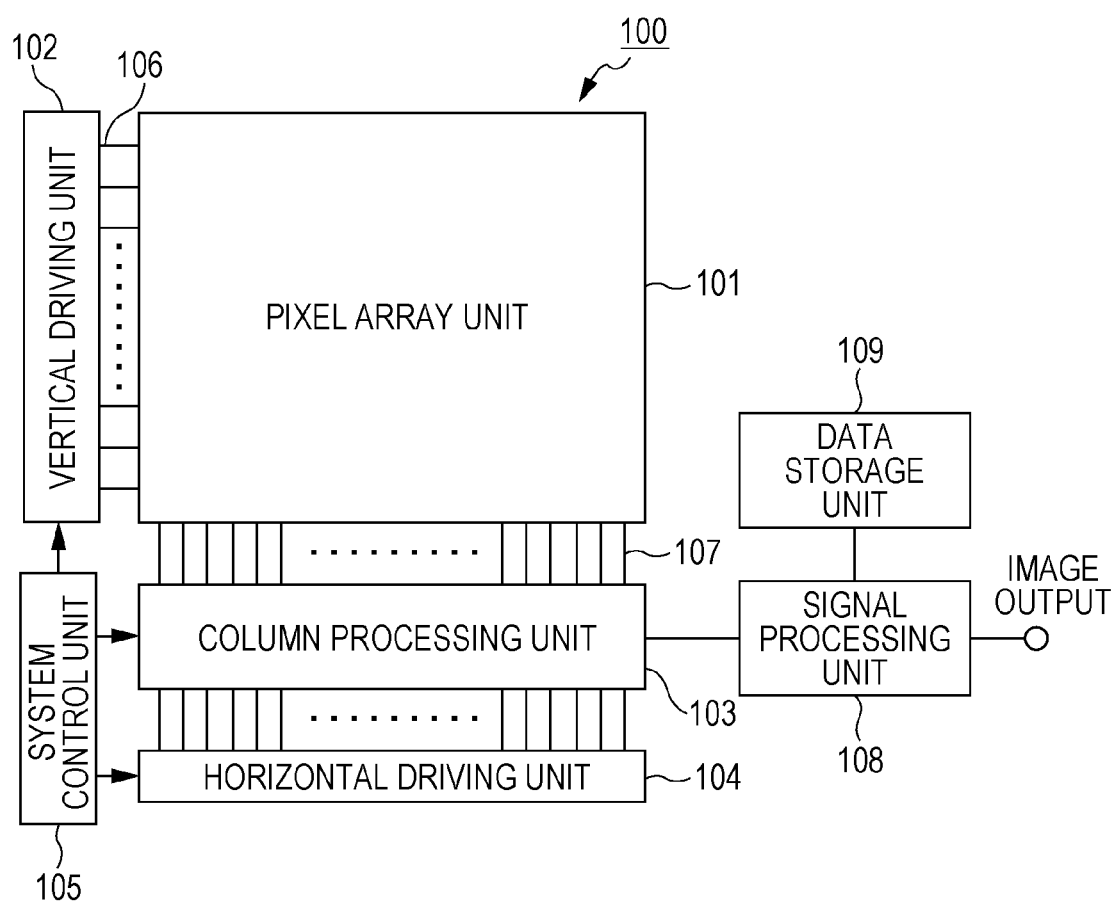
FIG. 1 is a schematic block configuration diagram of a solid-state imaging device according to a first embodiment of the present disclosure.

FIG. 1 illustrates the schematic block configuration of the solid-state imaging device according to the first embodiment. In addition, in the present embodiment, as the solid-state imaging device, a back-side illumination type CMOS image sensor will be cited as an example and described.

A CMOS image sensor 100 includes a pixel array unit 101, a vertical driving unit 102, a column processing unit 103, a horizontal driving unit 104, and a system control unit 105. In addition, the pixel array unit 101, the vertical driving unit 102, the column processing unit 103, the horizontal driving unit 104, and the system control unit 105 are formed on one semiconductor substrate (chip) not illustrated in FIG. 1.

Furthermore, the CMOS image sensor 100 includes a signal processing unit 108 and a data storage unit 109. In addition, the signal processing unit 108 and the data storage unit 109 may also be configured using an external signal processing unit provided in a substrate different from the CMOS image sensor 100, the external signal processing unit performing processing owing to a digital signal processor (DSP) or software, for example. In addition, the signal processing unit 108 and the data storage unit 109 may also be mounted on the same semiconductor substrate as the semiconductor substrate on which the pixel array unit 101 and the like are formed, for example.

The pixel array unit 101 includes a plurality of unit pixels (hereinafter, simply referred to as pixels) two-dimensionally disposed in a matrix manner. In addition, with respect to each pixel, a photoelectric conversion element (a photodiode in the present embodiment) is provided that generates and accumulates therewithin photocharge (hereinafter, simply referred to as electric charge) whose charge amount corresponds to an incident light amount.

The pixel array unit 101 further includes a pixel driving line 106 formed in a row direction (a left-right direction in FIG. 1) with respect to each row of a plurality of pixels two-dimensionally disposed in a matrix manner and a vertical signal line 107 formed in a column direction (an up-down direction in FIG. 1) with respect to each column thereof. In addition, each pixel driving line 106 is connected to a pixel in a corresponding row, and each vertical signal line 107 is connected to a pixel in a corresponding column.

In addition, one end portion of the pixel driving line 106 is connected to the output end portion of a row of the vertical driving unit 102, the row corresponding to the corresponding pixel driving line 106, and one end portion of the vertical signal line 107 is connected to the input end portion of a column of the column processing unit 103, the column corresponding to the corresponding vertical signal line 107. In addition, in FIG. 1, while, for the sake of providing a brief description, the pixel driving line 106 with respect to each row is indicated by one signal line, usually a plurality of signal lines for individually driving various kinds of transistors configuring the pixel are provided with respect to each row.

For example, the vertical driving unit 102 includes circuit elements such as a shift register, an address decoder, and the like, and outputs various kinds of driving signals to each pixel in the pixel array unit 101, thereby driving each pixel. At this time, for example, the vertical driving unit 102 simultaneously drives all pixels, or drives pixels in units of rows. In addition, in FIG. 1, while, for the sake of providing a brief description, the illustration of the specific configuration of the vertical driving unit 102 is omitted, usually the vertical driving unit 102 includes two scanning systems, namely, a read-scanning system and a sweep-out scanning system.

When a signal is read from a pixel, the read-scanning system sequentially subjects pixels in the pixel array unit 101 to selective scanning in units of rows. In addition, a pixel signal output from each pixel in a row selectively scanned owing to the read-scanning system in the vertical driving unit 102 is supplied to the column processing unit 103 through the corresponding vertical signal line 107.

The sweep-out scanning system performs sweep-out scanning for electric charge accumulated in a photoelectric conversion element within a pixel. This sweep-out operation is performed on a row (reading row) to be subjected to the read scanning by the read-scanning system, with preceding the read scanning by the time duration of a shutter speed. Owing to the sweep-out scanning of the sweep-out scanning system, unnecessary electric charge is swept out (reset) from a photoelectric conversion element in a pixel in the reading row. Namely, owing to the sweep-out operation (reset operation) for the unnecessary electric charge, performed in the sweep-out scanning system, a so-called electronic shutter operation is performed. In addition, the term "electronic shutter operation" here corresponds to an operation in which the electric charge of the photoelectric conversion element is discarded and exposure is newly started (the accumulation of electric charge is started).

A signal read owing to the operation (read operation) of the read-scanning system is a signal corresponding to a light amount with which the pixel array unit 101 is illuminated after the immediately preceding read operation or the electronic shutter operation. In addition, a time period between a read timing in the immediately preceding read operation or a sweep-out timing in the electronic shutter operation and a read timing in a current read operation turns out to be the accumulation time of electric charge (exposure time) in the pixel.

With respect to each pixel column in the pixel array unit 101, the column processing unit 103 performs predetermined signal processing on a pixel signal output from each pixel in a selected row through the vertical signal line 107, and temporarily holds the pixel signal subjected to the signal processing.

Specifically, as the signal processing, the column processing unit 103 performs at least noise reduction processing such as correlated double sampling (CDS) processing or the like, for example. Owing to the CDS processing in the column processing unit 103, it may be possible to remove a reset noise and a pixel-specific fixed pattern noise due to the threshold value variation of an amplification transistor or the like, for example. Furthermore, in addition to the above-mentioned noise elimination function, for example, a configuration may also be adopted where an Analog to Digital (AD) conversion function is provided in the column processing unit 103 and a digital signal is output.

For example, the horizontal driving unit 104 includes circuit elements such as a shift register, an address decoder, and the like, and sequentially subjects a unit circuit (not illustrated) provided in each pixel column in the column processing unit 103 to selective scanning. Owing to this selective scanning of the horizontal driving unit 104, a pixel signal subjected to signal processing in each unit circuit of the column processing unit 103 is sequentially output to the signal processing unit 108.

For example, the system control unit 105 includes a timing generator or the like, which generates timing signals for various kinds of operations in the CMOS image sensor 100. In addition, the various kinds of timing signals generated in the system control unit 105 are supplied to the vertical driving unit 102, the column processing unit 103, and the horizontal driving unit 104, and individual units are subjected to drive control on the basis of these timing signals.

The signal processing unit 108 includes at least an addition processing function, and performs various kinds of signal processing such as addition processing and the like on the pixel signal output from the column processing unit 103, for example. In addition, the data storage unit 109 temporarily stores therein data necessary when predetermined signal processing is performed in the signal processing unit 108.

(2) Configuration of Pixel

Figure 2:
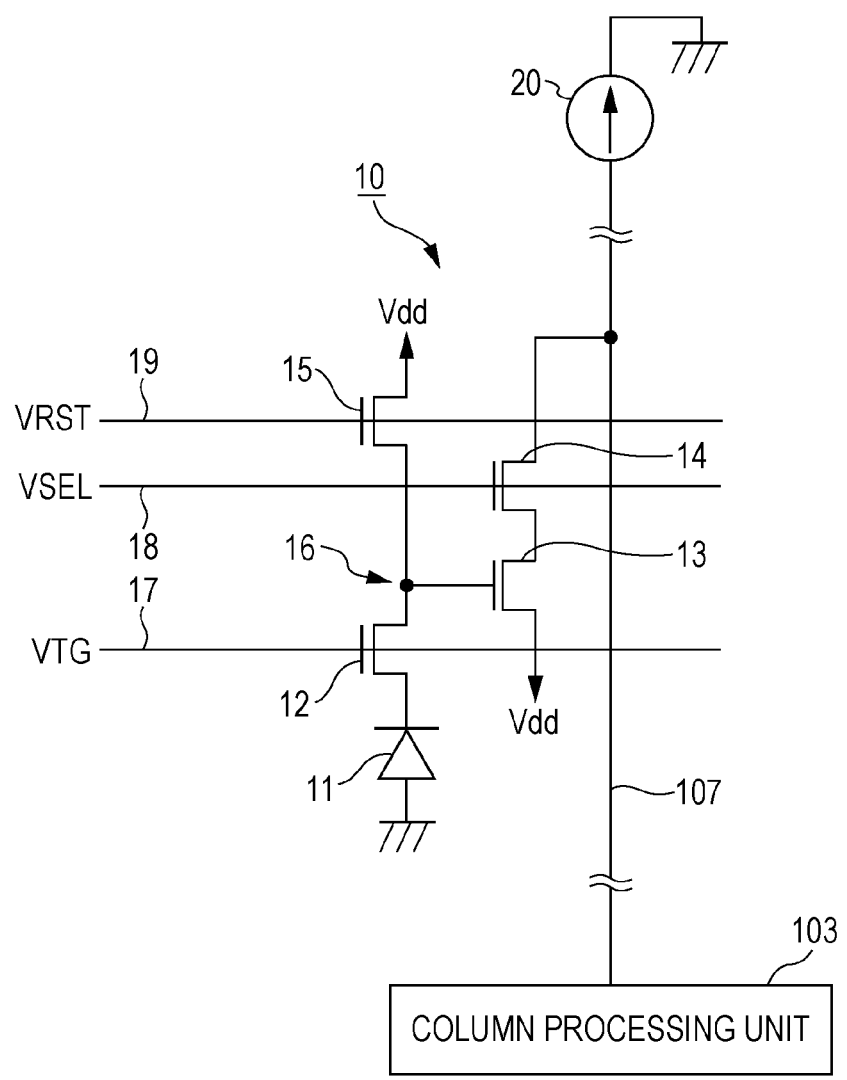
FIG. 2 is an equivalent circuit diagram of a pixel in the solid-state imaging device of the first embodiment.

FIG. 2 illustrates an example of the equivalent circuit of each pixel included in the pixel array unit 101. Usually, a pixel 10 includes one photodiode 11 (photoelectric conversion element), various kinds of active elements including MOS transistors provided for the one photodiode 11, and a floating diffusion region 16 (FD). In the example illustrated in FIG. 2, the pixel 10 includes the photodiode 11, a transfer transistor 12, an amplification transistor 13, a selection transistor 14, a reset transistor 15, and the floating diffusion region 16. In addition, here, an example is illustrated where the various kinds of transistors are configured using MOS transistors (hereinafter, referred to as NMOS transistors) having carrier polarities of an N type.

In addition, in the example illustrated in FIG. 2, an example is illustrated where, with respect to one pixel 10, three signal wiring lines (pixel driving lines 106) including a transfer wiring line 17, an address wiring line 18, and a reset wiring line 19 are provided in a row direction (a left-right direction in FIG. 2) and a vertical signal line 107 is provided in a column direction (an up-down direction in FIG. 2). Furthermore, in FIG. 2, an example is illustrated where the supply wiring line of a power source voltage Vdd and connection wiring lines between various kinds of MOS transistors are provided within one pixel 10. In addition, while not illustrated in FIG. 2, in the pixel 10, a two-dimensional wiring line to be used as a light shielding film is also provided in a pixel boundary portion and a black level detection pixel.

The photodiode 11 converts (photoelectric-converts) incident light into electric charge (electrons, here) whose amount corresponds to the light amount of the incident light. In addition, the anode of the photodiode 11 is grounded.

The transfer transistor 12 is provided between the cathode of the photodiode 11 and the floating diffusion region 16. When a transfer signal (VTG: voltage signal) of a high level is input to the gate of the transfer transistor 12 from the vertical driving unit 102 through the transfer wiring line 17, the transfer transistor 12 is put into an on-state, and transfers, to the floating diffusion region 16, the electric charge (electrons) photoelectric-converted in the photodiode 11. In addition, the electric charge transferred to the floating diffusion region 16 is converted into a voltage (electric potential) in the floating diffusion region 16.

The gate of the amplification transistor 13 is connected to the floating diffusion region 16 (FD). In addition, the drain of the amplification transistor 13 is connected to the supply terminal of the power source voltage Vdd, and the source of the amplification transistor 13 is connected to the vertical signal line 107 through the selection transistor 14. In addition, as illustrated in FIG. 2, the vertical signal line 107 is connected to a constant current source 20 external to the pixel 10, and accordingly, a source follower circuit is configured on the basis of the amplification transistor 13 and the constant current source 20. The amplification transistor 13 amplifies the electric potential of the floating diffusion region 16, and outputs the amplified signal, as a light accumulation signal (pixel signal), to the selection transistor 14.

The selection transistor 14 is provided between the amplification transistor 13 and the vertical signal line 107. When an address signal (VSEL) of a high level is input to the gate of the selection transistor 14 from the vertical driving unit 102 through the address wiring line 18, the selection transistor 14 is put into an on-state, and outputs, to the vertical signal line 107, a voltage signal corresponding to the electric potential amplified in the amplification transistor 13. In addition, the voltage signal of each pixel output to the vertical signal line 107 is transferred to the column processing unit 103.

The reset transistor 15 is provided between the supply terminal of the power source voltage Vdd and the floating diffusion region 16. When a reset signal (VRST) of a high level is input to the gate of the reset transistor 15 from the vertical driving unit 102 through the reset wiring line 19, the reset transistor 15 is put into an on-state, and resets the electric potential of the floating diffusion region 16 to the power source voltage Vdd.

In addition, in the present embodiment, various kinds of wiring lines connected to the gates of the above-mentioned various kinds of NMOS transistors are provided in units of rows, and the above-mentioned operations of the various kinds of NMOS transistors are simultaneously performed on individual pixels corresponding to one row.

[Inner Structure in Vicinity of Photodiode]

Figure 3:
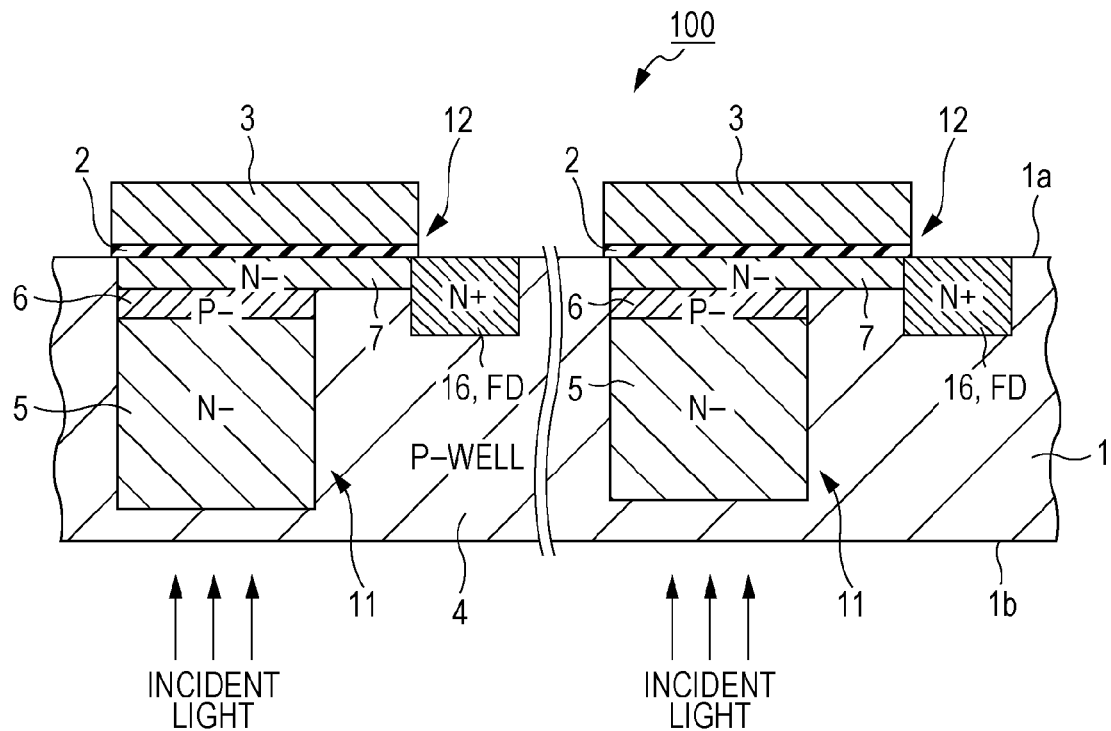
FIG. 3 is a schematic configuration cross-sectional view in the vicinity of a photodiode in the solid-state imaging device of the first embodiment.
Figure 4:
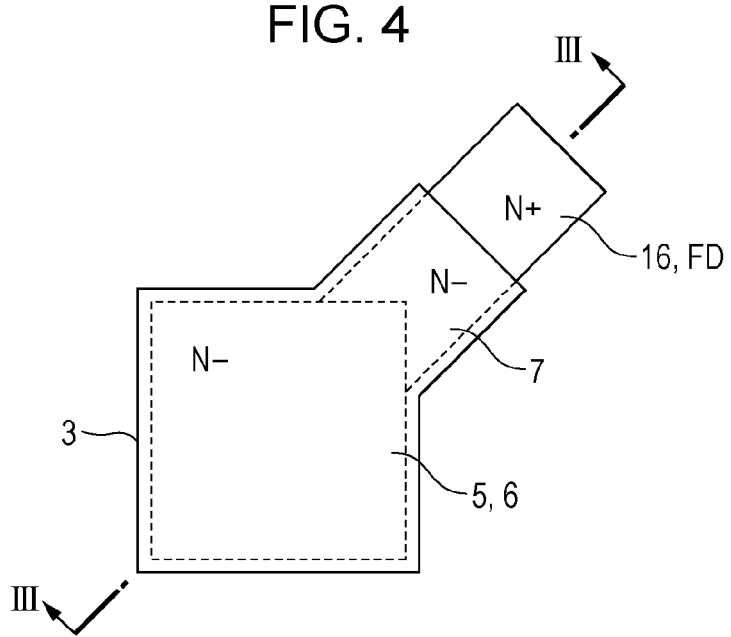
FIG. 4 is a schematic plan view in the vicinity of the photodiode in the solid-state imaging device of the first embodiment.

Next, the inner structure of the pixel 10 in the CMOS image sensor 100 of the present embodiment will be described. FIG. 3 and FIG. 4 illustrate the schematic configuration of the pixel 10 in the vicinity of the photodiode 11. In addition, FIG. 3 is a schematic configuration cross-sectional view in the vicinity of the photodiode 11, and FIG. 4 is a schematic plan view illustrating a disposition relationship among the photodiode 11, the transfer transistor 12, and the floating diffusion region 16. In this regard, however, an III-III cross-section in FIG. 4 corresponds to a cross-section in the vicinity of one photodiode 11.

In addition, in FIG. 3 and FIG. 4, for the sake of providing a brief description, a main part is only illustrated that relates to a discharge operation (overflow operation) for electric charge (surplus electrons) excessively converted in the photodiode 11 of the present embodiment described later. The other inner structure may be configured in the same way as a back-side illumination type CMOS image sensor of related art. Furthermore, hereinafter, it is assumed that one surface of a semiconductor substrate 1, located on a side where a wiring layer in which the photodiode 11 and various kinds of transistors around the photodiode 11 are wire-connected is formed, is referred to as a substrate surface 1a and a surface on a side (light incidence side) opposite thereto is referred to as a substrate back surface 1b (the other surface).

The CMOS image sensor 100 of the present embodiment includes the semiconductor substrate 1 (substrate), a gate insulation film 2 formed in a predetermined region in the substrate surface 1a of the semiconductor substrate 1, and a transfer gate 3 (gate electrode) of the transfer transistor 12, formed on the gate insulation film 2.

For example, the semiconductor substrate 1 is formed using an Si substrate of an N type, and includes a P type impurity layer (hereinafter, referred to as a P well 4), an N layer 5 (first impurity layer), a P layer 6 (second impurity layer), a surface N layer (third impurity layer), and the floating diffusion region 16 (impurity region portion). In addition, as illustrated in FIG. 3, the N layer 5, the P layer 6, the surface N layer, and the floating diffusion region 16 are formed so as to be embedded in the P well 4.

The N layer 5 is an impurity layer whose carrier polarity is an N type (first conductivity type), and the impurity concentration thereof may be about $1\times10^{17}$ cm$^{-3}$ to $1\times10^{18}$ cm$^{-3}$, for example. In addition, in the present embodiment, the photodiode 11 (photoelectric conversion portion) is formed using the N layer 5, and electrons generated owing to photoelectric conversion are accumulated in the N layer 5.

The P layer 6 is an impurity layer whose carrier polarity is a P type (second conductivity type), and formed on a surface on a substrate surface 1a side of the N layer 5 so as to be in contact therewith. The P layer 6 functions as a potential barrier (hereinafter, referred to as an overflow barrier) when surplus electrons overflowing in the N layer 5 of the photodiode 11 at the time of photoelectric conversion (during an electron accumulation time period) are discharged to the surface N layer 7 (floating diffusion region 16). In addition, the P layer 6 doubles as a pinning layer reducing a dark current. In addition, in the present embodiment, for example, the impurity concentration of the P layer 6 may be about $1\times10^{17}$ cm$^{-3}$ to $1\times10^{18}$ cm$^{-3}$.

The surface N layer 7 is an impurity layer whose carrier polarity is an N type, and the impurity concentration thereof may be about $1\times10^{17}$ cm$^{-3}$ to $1\times10^{18}$ cm$^{-3}$, for example. In addition, for example, the depth of the surface N layer 7 may be about 10 to 50 nm. The surface N layer 7 functions as a region (overflow drain) serving as a discharge destination for the surplus electrons overflowing in the N layer 5 at the time of photoelectric conversion.

In addition, the surface N layer 7 is formed so that a surface on a substrate surface 1a side thereof lies in the same plane as the substrate surface 1a of the semiconductor substrate 1. Namely, the surface N layer 7 is formed so as to be exposed on the substrate surface 1a.

In addition, as illustrated in FIG. 3 and FIG. 4, the surface N layer 7 is formed on a square-shaped surface on a substrate surface 1a side of the P layer 6 so as to be in contact therewith and cover the corresponding surface. Furthermore, as illustrated in FIG. 3 and FIG. 4, the surface N layer 7 is formed in a region extending from the corner portion of the P layer 6, which faces the floating diffusion region 16, to the floating diffusion region 16, and connected to the floating diffusion region 16. Namely, in the present embodiment, the surface N layer 7 is formed on the region of the P layer 6 and on the region of the P well 4, located between the photodiode 11 and the floating diffusion region 16.

In the present embodiment, as described above, the region (light receiving portion) of the photodiode 11 has a structure where the P layer 6 is sandwiched between the two N layers. In addition, in the present embodiment, as described above, the impurity concentration of each of the N layer 5, the P layer 6, and the surface N layer 7 is set relatively low (set lower than the impurity concentration of the floating diffusion region 16 described later). Accordingly, a change in a potential (impurity concentration) in each PN junction interface in the light receiving portion is not steep, and it may be possible to suppress the occurrence of a noise.

In addition, in the present embodiment, it is desirable that, for example, the impurity concentration or the like of each impurity layer is arbitrarily set so that a potential characteristic in the depth direction of the light receiving portion when the transfer gate 3 is in a non-conduction state is the same as that of the photodiode of an HAD type structure (P+/N- junction type) of related art. In this case, at the time of designing the light receiving portion in the present embodiment, it may be possible to apply the same potential design as that of related art, and for example, it may be possible to design the characteristic of a saturated electric charge amount or the like in the same way as a technique of related art.

The floating diffusion region 16 is formed using an impurity layer whose carrier polarity is an N type, and the impurity concentration thereof may be about $1\times10^{20}$ cm$^{-3}$, for example. Namely, in the present embodiment, the impurity concentration of the floating diffusion region 16 is set higher than the impurity concentration of the surface N layer 7. In addition, an embodiment of the present disclosure is not limited to this example, and the impurity concentration of the floating diffusion region 16 and the impurity concentration of the surface N layer 7 may be set to a same level.

In this regard, however, when the impurity concentration of the surface N layer 7 is set to a high concentration in the same way as the floating diffusion region 16, the electric potential (for example, the power source voltage Vdd) of an external terminal connected to the floating diffusion region 16 may be easily conducted to the surface N layer 7. In this case, it is likely that, also for a time period other than the time of transferring signal charge, the potential barrier of the P layer 6 disappears and electrons accumulated within the photodiode 11 leak. Therefore, when the leak of electrons within the photodiode 11 is considered, it is desirable that the impurity concentration of the surface N layer 7 is set lower than the impurity concentration of the floating diffusion region 16 in the same way as in the present embodiment.

The gate insulation film 2 is formed so as to cover the surface of the surface N layer 7. In addition, the gate insulation film 2 is formed using an insulation film such as an $SiO_2$ film or the like, for example.

The transfer gate 3 (TG) is formed on the gate insulation film 2 so as be in contact therewith. Namely, in the present embodiment, the transfer gate 3 is formed so as to cover the surface of the surface N layer 7 with the gate insulation film 2 being sandwiched therebetween. In addition, the transfer gate 3 may be formed using arbitrary conductive material, and may be formed using material such as polysilicon or the like, doped with an impurity, for example. In addition, in the present embodiment, the thickness of the transfer gate 3 may be about 100 to 300 nm.

In addition, the configurations (for example, impurity concentrations, layer thicknesses, formation material, and the like) of the various kinds of layers and the various kinds of regions forming the above-mentioned CMOS image sensor 100 are not limited to the above-mentioned example, and may be arbitrarily changed on the basis of a condition such as necessary performance, intended use, or the like, for example.

[Principle of Overflow Operation]

In the CMOS image sensor 100 of the present embodiment, the magnitude of the gate voltage VTG applied to the transfer gate 3 during an electron accumulation time period (photoelectric conversion time period) is controlled, thereby controlling the overflow operation for surplus electrons.

Specifically, now, it is assumed that the gate voltage VTG applied to the transfer gate 3 when signal charge is transferred from the photodiode 11 to the floating diffusion region 16 (hereinafter, referred to as complete transfer), namely, when the transfer gate 3 is put into a conduction state, is a high-level voltage VH (first voltage). In addition, it is assumed that the gate voltage VTG applied to the transfer gate 3 when connection between the photodiode 11 and the floating diffusion region 16 is put into a non-conduction state is a low-level voltage VL (second voltage). Furthermore, it is assumed that the gate voltage VTG applied to the transfer gate 3 during a time period (electron accumulation time period) when the photodiode 11 is illuminated with light and the light is converted into charge (electrons) is a bias voltage VM (third voltage).

In addition, in the present embodiment, the bias voltage VM is set so that the bias voltage VM applied to the transfer gate 3 during the electron accumulation time period is set to a positive value (VL<VM<VH) smaller than the high-level voltage VH and larger than the low-level voltage VL. For example, when it is assumed that the high-level voltage VH is the power source voltage Vdd and the low-level voltage VL is a ground voltage (0 V), the bias voltage VM is set to a value in the range of 0<VM<Vdd.

In addition, as described later, in the present embodiment, during the electron accumulation time period, only surplus electrons are discharged, through the P layer 6, from the N layer 5 in the photodiode 11 to the surface N layer 7. Therefore, in the present embodiment, the bias voltage VM applied to the transfer gate 3 and the condition of each impurity layer, for example, the impurity concentration or the like thereof, are arbitrarily set so that the overflow barrier of the P layer 6 during the electron accumulation time period becomes a potential causing only the surplus electrons to be discharged to the surface N layer 7.

Here, first, the principle of the overflow operation for the surplus electrons in the photodiode 11 in the CMOS image sensor 100 of the present embodiment will be specifically described with reference to FIGS. 5A and 5B. In addition, FIG. 5A and FIG. 5B are diagrams illustrating a change in a potential Φ with respect to an electron at the time of the overflow operation, in a depth region ranging from the substrate surface 1a of the semiconductor substrate 1 to the bottom portion of the N layer 5 of the photodiode 11.

In the present embodiment, in a state where the low-level voltage VL (=0 V) is applied to the transfer gate 3, while not illustrated in FIG. 5B, the potential barrier (Φ) of the surface N layer 7 with respect to an electron is higher than the potential (overflow barrier) of the P layer 6. In this case, electrons within the photodiode 11 do not flow to the surface N layer 7 side.

However, when the positive bias voltage VM in the range of 0<VM<Vdd is applied to the transfer gate 3 during the electron accumulation time period, the potential of the surface N layer 7 with respect to an electron becomes lower than the overflow barrier of the P layer 6, as illustrated by the characteristic of a solid line in FIG. 5B. As a result, surplus electrons occurring in the photodiode 11 during the electron accumulation time period are discharged across the overflow barrier of the P layer 6 to the surface N layer 7.

Namely, in the present embodiment, when the positive bias voltage VM in the range of 0<VM<Vdd is applied to the transfer gate 3, an overflow path is formed in a direction (the thickness direction of the semiconductor substrate 1) headed from the N layer 5 in the photodiode 11 to the surface N layer 7 through the P layer 6. In addition, the surplus electrons discharged to the surface N layer 7 are transferred to the floating diffusion region 16.

In addition, if the high-level voltage VH (=Vdd) is applied to the transfer gate 3 when the signal charge accumulated in the photodiode 11 is completely transferred, the overflow barrier of the P layer 6 disappears as illustrated by the characteristic of a dashed-dotted line in FIG. 5B. In this case, the signal charge (electrons) accumulated in the photodiode 11 is transferred to the floating diffusion region 16 through the P layer 6 and the surface N layer 7.

Next, a relationship between the overflow operation during the electron accumulation time period and a read operation for a pixel signal at the time of the complete transfer of the signal charge will be specifically described with reference to FIGS. 6A to 6C. In addition, FIGS. 6A to 6C are the timing charts of the operations of the selection transistor 14, the reset transistor 15, and the transfer transistor 12 in a predetermined pixel 10. Specifically, FIGS. 6A to 6C illustrate the signal waveforms of an address signal (VSEL) applied to the selection transistor 14, a reset signal (VRST) applied to the reset transistor 15, and a transfer signal (VTG) applied to the transfer transistor 12, respectively.

First, in the predetermined pixel 10, as illustrated in FIG. 6A, the gate voltage VSEL of the selection transistor 14 is switched from a low level (for example, 0 V) to a high level (for example, Vdd) at a predetermined timing t1 during the electron accumulation time period of the photodiode 11. Accordingly, the predetermined pixel 10 is put into a selection state.

In addition, as illustrated in FIG. 6B, at the timing t1, for example, a pulse voltage whose amplitude is Vdd is applied to the gate of the reset transistor 15, and the reset transistor 15 is put into an on-state. Accordingly, unnecessary electric charge accumulated in the floating diffusion region 16 is discharged through the reset transistor 15, thereby performing a read operation for a reset level.

In addition, since, as illustrated in FIG. 6C, a read time period for the reset level also corresponds to the electron accumulation time period, the positive bias voltage VM in the range of VL<VM<VH is applied to the transfer gate 3 of the transfer transistor 12 during this time period. Therefore, as described in FIGS. 5A and 5B, during the read time period for the reset level (accumulation time period), surplus electrons within the photodiode 11 are discharged to the floating diffusion region 16 through the P layer 6 and the surface N layer 7.

After that, as illustrated in FIG. 6C, at a timing t2 (>t1), the gate voltage VTG of the transfer transistor 12 is switched from an intermediate level (VM) to a high level (for example, VH=Vdd). Accordingly, the transfer gate 3 (between the photodiode 11 and the floating diffusion region 16) is put into a conduction state, signal charge accumulated in the photodiode 11 is completely transferred to the floating diffusion region 16, and a read operation for a signal level is started. In addition, the read operation for the signal level is performed between the timing t2 and a timing t3 at which the gate voltage VSEL of the selection transistor 14 is switched from a high level to a low level. In the present embodiment, in this way, the overflow operation for the surplus electrons in the photodiode 11, the complete transfer operation for the signal charge, and the read operation for the signal level are performed.

[Manufacturing Method for CMOS Image Sensor]

Next, an example of a manufacturing method for the CMOS image sensor 100 of the present embodiment will be described with reference to FIGS. 7 to 11. Here, mainly, procedures will be described that leads from a process for producing the photodiode 11 (light receiving portion) to a process for producing the floating diffusion region 16. Therefore, for the sake of providing a brief description, FIGS. 7 to 11 illustrate schematic cross-sectional views in the vicinity of the forming region of the photodiode 11 of the predetermined pixel 10. In addition, it may be possible to implement processes other than the processes described in FIG. 7 to FIG. 11, in the same way as in the production method of the back-side illumination type CMOS image sensor of related art.

First, as the semiconductor substrate 1, an Si substrate of an N type is prepared. Next, on the semiconductor substrate 1, owing to a method based on Shadow Trench Isolation (STI) or Local Oxidation of Silicon (LOCOS), an element separation region is formed (not illustrated). After that, a P type impurity is implanted into the semiconductor substrate 1 owing to an ion implantation method, and the P well 4 of a predetermined depth is formed in a predetermined region in a surface (substrate surface 1a) on the ion implantation side of the semiconductor substrate 1.

Figure 7:
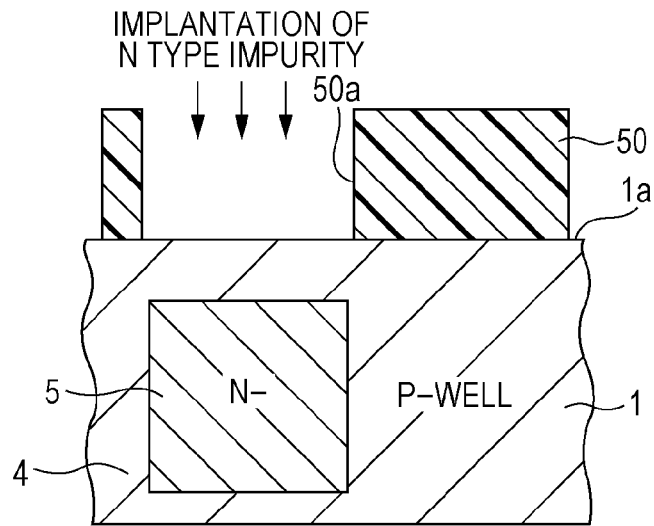
FIG. 7 is a diagram for explaining a manufacturing method for the solid-state imaging device according to the first embodiment.

Next, a photoresist film 50 is formed on the substrate surface 1a of the semiconductor substrate 1. After that, using a photolithographic technique, patterning processing is performed on the photoresist film 50, and as illustrated in FIG. 7, the photoresist film 50 in the forming region of the photodiode 11 is removed, thereby forming an aperture portion 50a. Accordingly, the substrate surface 1a of the semiconductor substrate 1 is exposed in the aperture portion 50a of the photoresist film 50.

Next, as illustrated in FIG. 7, owing to the ion implantation method, an N type impurity is implanted into the semiconductor substrate 1 from the photoresist film 50 side of the semiconductor substrate 1, and the N layer 5 of the photodiode 11 is formed in a position of a predetermined depth within the P well 4.

Figure 8:
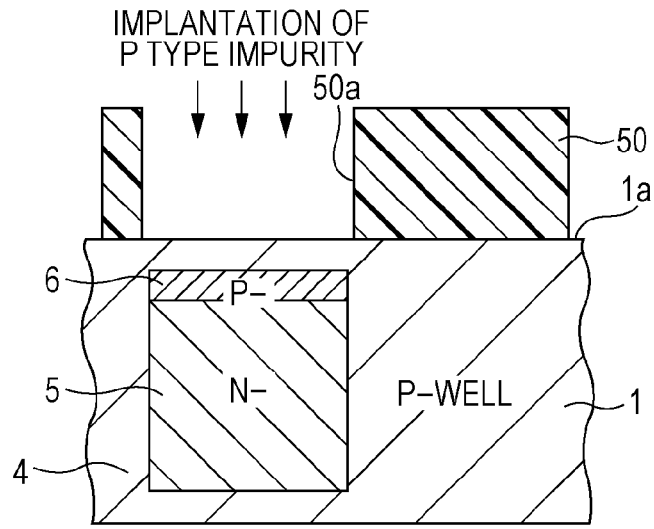
FIG. 8 is a diagram for explaining the manufacturing method for the solid-state imaging device according to the first embodiment.

Next, as illustrated in FIG. 8, owing to the ion implantation method, a P type impurity is implanted into the semiconductor substrate 1 from the photoresist film 50 side of the semiconductor substrate 1, and the P layer 6 is formed on a surface on the substrate surface 1a side of the N layer 5 so as to be in contact therewith. At this time, since the P layer 6 is formed using the photoresist film 50 used in the process illustrated in FIG. 7 (using the same mask), the position of the end portion of the P layer 6 in the substrate in-plane direction is determined in a self-aligning manner with respect to the N layer 5. In addition, while, in the present embodiment, an example is illustrated where the N layer 5 and the P layer 6 are formed in this order, an embodiment of the present disclosure is not limited to this example, and the P layer 6 may be formed prior to the N layer 5.

Figure 9:
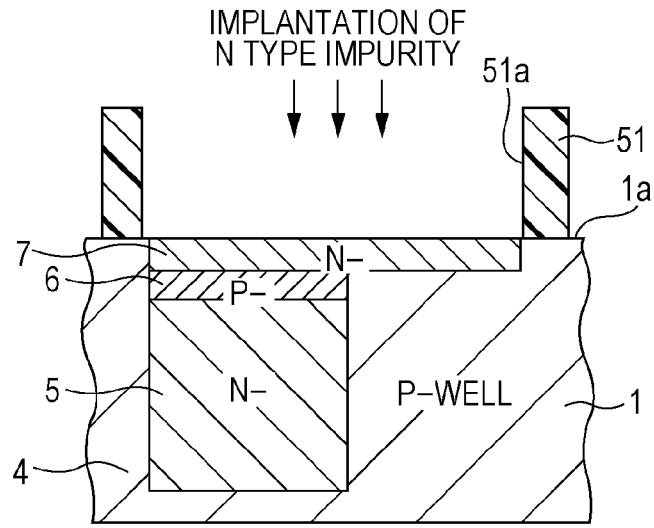
FIG. 9 is a diagram for explaining the manufacturing method for the solid-state imaging device according to the first embodiment.

Next, after the photoresist film 50 has been removed, a photoresist film 51 is formed on the substrate surface 1a of the semiconductor substrate 1 again. After that, using the photolithographic technique, patterning processing is performed on the photoresist film 51 and as illustrated in FIG. 9, the photoresist film 51 in the forming region of the surface N layer 7 is removed, thereby forming an aperture portion 51a. Accordingly, the substrate surface 1a of the semiconductor substrate 1 is exposed in the aperture portion 51a of the photoresist film 51.

Next, as illustrated in FIG. 9, owing to the ion implantation method, an N type impurity is implanted into the semiconductor substrate 1 from the photoresist film 51 side of the semiconductor substrate 1, and the surface N layer 7 is formed on the P layer 6 and the P well 4. In addition, at this time, the surface N layer 7 is formed so that a surface on the substrate surface 1a side of the surface N layer 7 is exposed on the substrate surface 1a.

Next, after the photoresist film 51 has been removed, an SiO$_2$ film is formed in a predetermined region on the substrate surface 1a of the semiconductor substrate 1 owing to a thermal oxidation method. Next, for example, a polysilicon film or a metal film is laminated on the SiO$_2$ film owing to a Chemical Vapor Deposition (CVD) method, thereby forming a gate electrode film.

Figure 10:
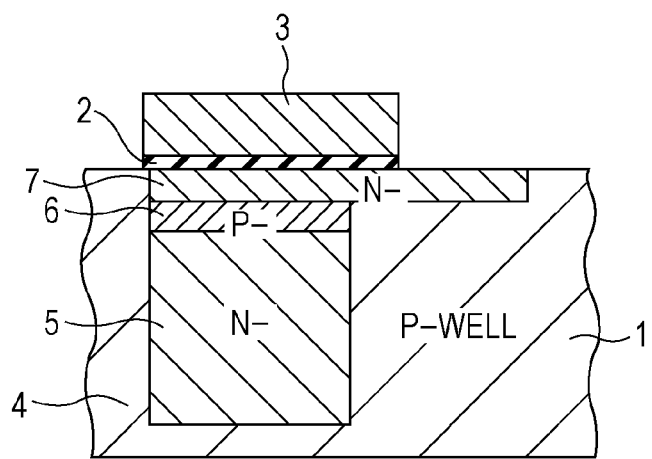
FIG. 10 is a diagram for explaining the manufacturing method for the solid-state imaging device according to the first embodiment.

Next, a resist mask is formed in the forming region of the transfer gate 3 in the gate electrode film. Specifically, a resist mask is formed in the region of the gate electrode film formed in the upper portion of the photodiode 11 and the region of the gate electrode film formed on the region of a portion of the surface N layer 7, the portion of the surface N layer 7 being to be a region for connecting the photodiode 11 and the floating diffusion region 16 to be formed in a later process. In addition, the gate electrode film and the SiO$_2$ film, located in a region other than the resist mask, are removed. After that, the resist mask is removed. As a result, as illustrated in FIG. 10, on or over the substrate surface 1a, the gate insulation film 2 and the transfer gate 3 are formed in this order so as to cover the upper portion of the photodiode 11 and the portion of the surface N layer 7, the portion being to be the region for connecting the photodiode 11 and the floating diffusion region 16.

Figure 11:
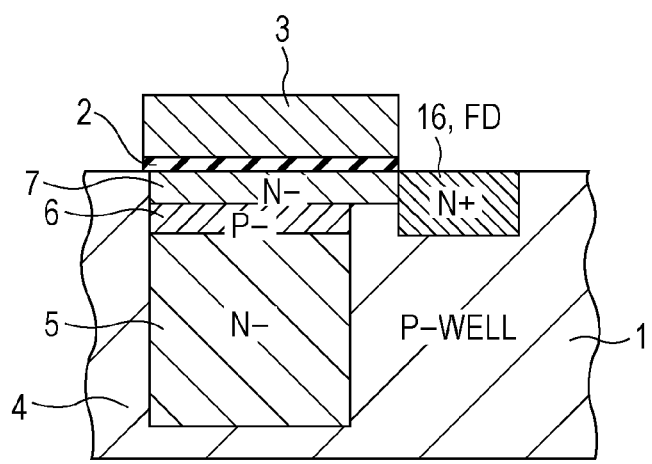
FIG. 11 is a diagram for explaining the manufacturing method for the solid-state imaging device according to the first embodiment.

Next, a region is masked that is located elsewhere than the forming region of the floating diffusion region 16, which includes a portion of the surface N layer 7, exposed on the substrate surface 1a. In addition, owing to the ion implantation method, an N type impurity is implanted into the forming region of the floating diffusion region 16, and after that, activation annealing treatment is performed on the forming region of the floating diffusion region 16, thereby forming the floating diffusion region 16. Accordingly, as illustrated in FIG. 11, the floating diffusion region 16 is formed that is connected to the surface N layer 7.

After that, while not illustrated, in the same way as a manufacturing method for the back-side illumination type CMOS image sensor of related art, the substrate back surface 1b of the semiconductor substrate 1 is polished and thin-walled owing to a chemical mechanical polishing (CMP) method or the like, for example. Next, for example, owing to the CVD method or the like, a color filter and an on-chip lens are formed on the substrate back surface 1b of the semiconductor substrate 1 in this order. In addition, a protective film is formed on the on-chip lens. In the present embodiment, in such a way as described above, the CMOS image sensor 100 is produced.

Diverse Advantageous Effects Obtained in Present Embodiment

As described above, in the CMOS image sensor 100 of the present embodiment, the P layer 6 is provided on the N layer 5 of the photodiode 11, and furthermore, on the P layer 6, the surface N layer 7 is provided that is exposed on the substrate surface 1a and connected to the floating diffusion region 16. In addition, the transfer gate 3 of the transfer transistor 12 is provided so as to cover the surface N layer 7. In the present embodiment, each pixel 10 is caused to have such a configuration as described above and hence, the overflow barrier for electrons is formed in the P layer 6.

Furthermore, in the present embodiment, during the electron accumulation time period, the positive bias voltage VM is applied to the transfer gate 3, the positive bias voltage VM lying between the high-level voltage VH (for example, the power source voltage Vdd) causing the overflow barrier to disappear and the low-level voltage VL (for example, 0 V) putting the transfer gate 3 into the non-conduction state. Accordingly, the potential barrier of the surface N layer 7 is caused to be lower than the overflow barrier of the P layer 6, and surplus electrons in the photodiode 11 are discharged to the surface N layer 7 through the P layer 6 (overflow barrier). In addition, surplus electrons discharged to the surface N layer 7 are transferred to the floating diffusion region 16 to be finally discharged to the outside of the pixel.

Accordingly, in the present embodiment, also in the back-side illumination type CMOS image sensor 100, it may be possible to more reliably discharge surplus electrons in the photodiode 11 to the outside of the pixel, and it may be possible to further suppress the occurrence of blooming, color mixture, or the like, for example.

Furthermore, the above-mentioned discharge mechanism for surplus electrons in the CMOS image sensor 100 of the present embodiment has the following advantageous effects over the discharge mechanism for surplus electrons, proposed in Japanese Unexamined Patent Application Publication No. 2008-103668, for example.

In Japanese Unexamined Patent Application Publication No. 2008-103668, as described above, in the back-side illumination type solid-state imaging device, the contact is formed in the upper portion of the photodiode, and surplus electrons in the photodiode is discharged through the contact. In this method, since the contact capable of obtaining ohmic contact is formed on the semiconductor substrate, it is necessary to cause a carrier to quantum mechanically tunnel through a Schottky barrier. In this case, it is necessary to form a semiconductor layer to be in contact with the contact using a highly concentrated impurity layer of about $1 \times 10^{20}$ cm$^{-3}$. Namely, in the technique proposed in Japanese Unexamined Patent Application Publication No. 2008-103668, it is necessary to provide an impurity layer having a high-impurity concentration, in the upper portion of the photodiode.

In addition, in the technique proposed in Japanese Unexamined Patent Application Publication No. 2008-103668, so as to obtain an HAD type photodiode as the photodiode, it is necessary to form, around the surface N+ layer, a high impurity concentrated P+ layer not to be depleted or an impurity layer whose thickness causes depletion not to occur in a depth direction.

However, such a discharge mechanism for surplus electrons as in Japanese Unexamined Patent Application Publication No. 2008-103668 is likely to cause the following adverse effects on a pixel characteristic.

(1) Since an aperture portion used for forming a contact in the upper portion of a photodiode is formed owing to etching, the etching damage thereof enters a depletion layer formed around the photodiode, and a dark current is likely to occur.

(2) When an overflow barrier portion is formed using a highly-concentrated P type impurity layer, a change in a junction density in an interface between the P type impurity layer and the N layer of the photodiode becomes highly steep, and a junction electric field becomes high. Also in this case, a dark current easily occurs.

(3) When a P layer in the overflow barrier portion is formed with a sufficient thickness in the depth direction of a substrate, since the position of the N layer in the photodiode becomes deeper, it is difficult to transfer signal charge to a floating diffusion region, and an afterimage occurs in some cases.

On the other hand, in the present embodiment, potential control for the surface N layer 7 is performed owing to the transfer gate 3, and the overflow path for surplus electrons is formed. Namely, in the present embodiment, it is not necessary to directly form a contact in the upper portion of the photodiode 11. Therefore, in the present embodiment, since damage at the time of contact formation does not occur, it may be possible to solve the problem of Japanese Unexamined Patent Application Publication No. 2008-103668, described in the above-mentioned (1), and it may be possible to improve an effect for suppressing the dark current.

In addition, in the present embodiment, since it is not necessary to set, to a high concentration, the impurity concentration of the surface N layer 7 formed on the uppermost surface side of the semiconductor substrate 1, it may also be possible to set, to a low concentration, the impurity concentration of the P layer 6 to be an overflow barrier. In this case, since it may be possible to set the junction electric field of the PN junction interface of the light receiving portion low, it may also be possible to solve the problem of Japanese Unexamined Patent Application Publication No. 2008-103668, described in the above-mentioned (2), and it may be possible to suppress the occurrence of the dark current.

Furthermore, in the present embodiment, since it is not necessary to thicken the P layer 6 to be the overflow barrier, it may also be possible to solve the problem of Japanese Unexamined Patent Application Publication No. 2008-103668, described in the above-mentioned (3).

In addition, apart from the discharge method for surplus electrons, proposed in Japanese Unexamined Patent Application Publication No. 2008-103668, for example, a method may be also considered where, in the HAD type photodiode of related art, a voltage is applied to a transfer gate during an electron accumulation time period, the voltage not putting the transfer gate into a complete non-conduction state. In this case, the channel portion of a transfer transistor formed in the lower portion of the transfer gate is used as an overflow path. Namely, in this case, the overflow path is formed in the substrate in-plane direction of a semiconductor substrate.

However, for example, the dimensions of a distance between the photodiode and a floating diffusion region, a transfer gate length, a resist line width, and the like fluctuate owing to mask misalignment at the time of manufacturing or a variation due to a forming process. Therefore, when the miniaturization of a pixel has been advanced, variations in the dimensions of a distance between the photodiode and the floating diffusion region, the transfer gate length, the resist line width, and the like become large in an in-plane direction, for example.

When such variations in the dimensions in the in-plane direction become large, a variation in the potential of an overflow barrier becomes clear with respect to each pixel. Namely, in the method where the lower portion of the transfer gate is used as the overflow barrier, when the miniaturization of a pixel has been advanced, it is likely to be difficult to stably form the overflow barrier in the lower portion of the transfer gate. In addition, when a variation in the potential of the overflow barrier becomes large, this variation is likely to emerge as a fixed pattern noise at the time of outputting when electric charge is saturated.

On the other hand, in the present embodiment, as described above, the overflow path for surplus electrons in the photodiode 11 is formed in the thickness direction of the semiconductor substrate 1. Furthermore, in the present embodiment, the implantation depth of an impurity when the impurity layer of an N type or a P type is formed owing to the ion implantation is changed, thereby forming the overflow path. Namely, in the present embodiment, since the length of the overflow path is determined on the basis of the implantation depths of impurities when the N layer 5, the P layer 6, and the surface N layer 7 are produced, the length of the overflow path does not depend on a process variation in the in-plane direction of the substrate surface 1a. In addition, in the present embodiment, since the impurity concentration of the P layer 6 does not vary on the basis of the process variation in the in-plane direction of the substrate surface 1a, the fluctuation of the potential of the overflow barrier also does not occur owing to the process variation.

Therefore, in the CMOS image sensor 100 of the present embodiment, even if the miniaturization of the pixel 10 has been advanced, it may be possible to reduce a variation in the potential of the overflow barrier, and it may be possible to stably form the overflow barrier. Accordingly, in the present embodiment, it may be possible to uniformly and accurately discharge surplus electrons in the photodiode 11 regardless of the process variation of the CMOS image sensor 100.

Furthermore, as another discharge method for surplus electrons, a method may also be considered where, in the backside illumination type CMOS image sensor of related art, an overflow path is formed separately in the in-plane direction of the substrate. However, in this method, the area of a chip increases. On the other hand, in the present embodiment, since, as described above, the overflow path is formed in the thickness direction of the semiconductor substrate 1 (it is not necessary to form an overflow path in the in-plane direction separately), it may be possible to avoid an increase in the area of the chip. Namely, in the present embodiment, it may be possible to stably form the overflow barrier without increasing the area of the chip.

[Configuration of Electronic Device]

The above-mentioned CMOS image sensor 100 (solid-state imaging device) of the present embodiment may be used with being installed in an arbitrary electronic device in which a solid-state imaging device is used as an image capturing unit. Examples of the electronic device include imaging devices (camera systems) such as a digital still camera, a video camera, and the like, mobile terminal devices such as a mobile phone and the like, which have imaging functions, a copying machine in which a solid-state imaging device is used as an image reading unit, and the like. Here, as an example of the electronic device, an imaging device will be cited and the configuration thereof will be described. In addition, a camera module installed in the electronic device is also called an imaging device in some cases.

Figure 12:
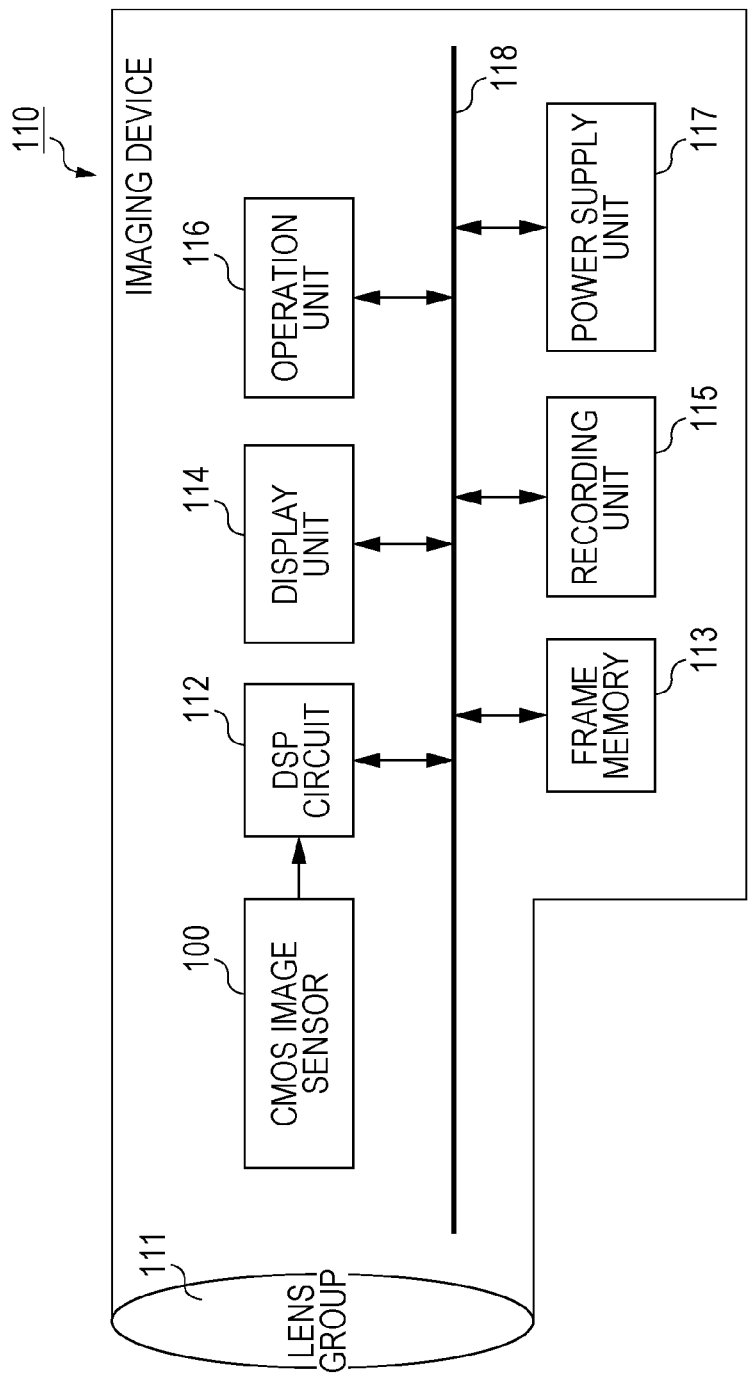
FIG. 12 is a schematic block configuration diagram of an imaging device equipped with the solid-state imaging device according to the first embodiment.

FIG. 12 illustrates the schematic block configuration of an imaging device to which the CMOS image sensor 100 of the present embodiment is applied.

The imaging device 110 includes an optical unit 111, the above-mentioned CMOS image sensor 100 of the present embodiment, and a DSP circuit 112 (signal processing circuit) serving as a camera signal processing circuit. In addition, the imaging device 110 includes a frame memory 113, a display unit 114, a recording unit 115, an operation unit 116, and a power supply unit 117. In addition, the DSP circuit 112, the frame memory 113, the display unit 114, the recording unit 115, the operation unit 116, and the power supply unit 117 are electrically connected to one another through a bus line 118.

For example, the optical unit 111 is configured using a lens group and the like. The optical unit 111 captures incident light (image light) from a subject, and forms an image on the imaging surface of the CMOS image sensor 100 owing to the incident light.

The CMOS image sensor 100 converts the light amount of the incident light focused on the imaging surface by the optical unit 111 into electrical signals in units of pixels, and outputs the electrical signals as pixel signals. In addition, since the CMOS image sensor 100 includes the above-mentioned discharge function for surplus electrons in the photodiode 11, it may be possible to image a high-quality image in which blooming, color mixture, or the like is further suppressed, for example, in the present embodiment.

For example, the display unit 114 includes a display device equipped with a panel such as a liquid crystal panel, an organic Electro Luminescence (EL) panel, or the like, and displays a moving image or a still image, imaged in the CMOS image sensor 100. The recording unit 115 records the moving image or the still image, imaged in the CMOS image sensor 100, in a recording medium such as a video tape, a Digital Versatile Disk (DVD), or the like, for example.

On the basis of an predetermined operation of a user, the operation unit 116 outputs operation instruction signals for causing various kinds of functions included in the imaging device 110 to operate. The power supply unit 117 arbitrarily supplies, to corresponding units, various kinds of power sources to be the operation power sources of the DSP circuit 112, the frame memory 113, the display unit 114, the recording unit 115, and the operation unit 116, respectively.

In addition, in the imaging device 110 illustrated in FIG. 12, the CMOS image sensor 100 may also have the form of being formed as a single chip, and may also have the module-like form of including an imaging function into which an imaging unit and a signal processing unit or an optical system are collectively packaged.

2. Second Embodiment

In the first embodiment, an example has been described where the gate voltage VTG applied to the transfer gate 3 is adjusted during the electron accumulation time period of the photodiode 11 and hence, the overflow path for surplus electrons is formed within the pixel 10. In a second embodiment, an example of a configuration will be described where, owing to another method, the overflow path for surplus electrons is formed within a pixel.

Figure 13:
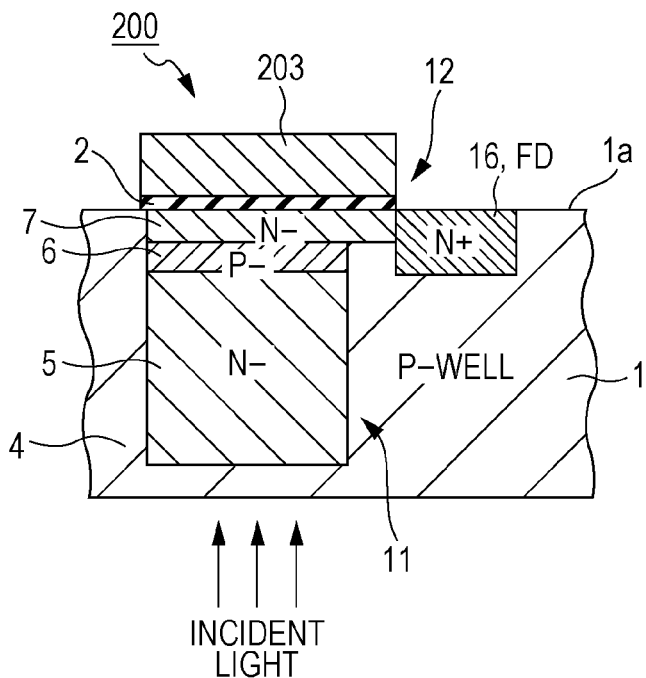
FIG. 13 is a schematic configuration cross-sectional view in the vicinity of a photodiode in a solid-state imaging device according to a second embodiment.

FIG. 13 illustrates the inner structure of a pixel in a CMOS image sensor of the present embodiment. FIG. 13 is a schematic configuration cross-sectional view in the vicinity of a photodiode. In addition, in FIG. 13, for the sake of providing a brief description, a main part is only illustrated that relates to a discharge operation (overflow operation) for surplus electrons in the photodiode 11. The other inner structure may be configured in the same way as the back-side illumination type CMOS image sensor of related art. In addition, in a CMOS image sensor 200 in the present embodiment illustrated in FIG. 13, the same configuration as the configuration of the CMOS image sensor 100 in the first embodiment illustrated in FIG. 3 will be illustrated with a same symbol being assigned thereto.

The CMOS image sensor 200 of the present embodiment includes the semiconductor substrate 1, the gate insulation film 2 formed in a predetermined region in the substrate surface 1a of the semiconductor substrate 1, and a transfer gate 203 (TG) of the transfer transistor 12, formed on the gate insulation film 2. In addition, various kinds of circuits (various kinds of transistors) around the photodiode 11 and the whole configuration of the CMOS image sensor 200 have the same configurations as those of the first embodiment (refer to FIG. 1 and FIG. 2).

In addition, in the present embodiment, it is assumed that the semiconductor substrate 1 and the gate insulation film 2 have the same configurations as those of the first embodiment. Namely, also in the CMOS image sensor 200 of the present embodiment, the P layer 6 of a low impurity concentration is provided on the N layer 5 of the photodiode 11 formed within the P well 4 of the semiconductor substrate 1, so as to be in contact with the N layer 5. Furthermore, also in the present embodiment, the surface N layer 7 of a low impurity concentration, which is to be the discharge destination of surplus electrons, is formed on the P layer 6 so as to be in contact therewith. In this regard, however, at this time, in the same way as in the first embodiment, the surface N layer 7 is formed so as to be exposed on the substrate surface 1a of the semiconductor substrate 1, and connected to the floating diffusion region 16 (FD). In addition, the gate insulation film 2 is formed on the substrate surface 1a so as to cover the surface N layer 7.

In the same way as in the first embodiment, the transfer gate 203 is formed on the gate insulation film 2 so as to be in contact therewith. In this regard, however, in the present embodiment, the transfer gate 203 is formed using conductive material having a work function smaller than the work function of the semiconductor substrate 1 (N type Si substrate). Specifically, the transfer gate 203 is formed using conductive material whose work function is less than or equal to 4.6 eV, more preferably, less than or equal to 4.3 eV.

As conductive material having the above-mentioned work function, for example, metal such as Ti, V, Ni, Zr, Ni, Mo, Ru, Hf, Ta, W, Pt, or the like, alloy including one of these metals, or compound of one of these metals may be used. In the present embodiment, it is desirable that, from among these conductive materials, in particular, metal such as Hf, Ta, or the like, alloy including one of these metals, or compound of one of these metals is used. In addition, for example, the work function of hafnium silicate (HfSi) is about 4.1 to 4.3 eV.

When the ground voltage (0 V) is applied to the transfer gate 203 of the above-mentioned configuration, it may be possible to lower the potential barrier of the surface N layer 7 with respect to an electron on the basis of a relationship between the work function of the transfer gate 203 and the work function of the semiconductor substrate 1, compared with the overflow barrier of the P layer 6. Namely, in the present embodiment, when the ground voltage is applied to the transfer gate 203, it may be possible to obtain the same state as that obtained when the positive bias voltage VM is applied to the transfer gate 3 in the first embodiment, for example. In this case, in the same way as in the first embodiment, surplus electrons in the photodiode 11 is discharged across the P layer 6 (overflow barrier) from the N layer 5 of the photodiode 11 to the surface N layer 7.

Therefore, in the present embodiment, the formation material (work function) of the transfer gate 203 is arbitrarily selected, and hence, it may be possible to discharge surplus electrons in the photodiode 11 without applying the positive bias voltage VM to the transfer gate 203 separately. In addition, in the present embodiment, at the time of the complete transfer of the signal charge of the photodiode 11, in the same way as in the first embodiment, the high-level voltage VH such as the power source voltage Vdd or the like is applied to the transfer gate 203, for example, and the overflow barrier of the P layer 6 is caused to disappear.

As described above, in the CMOS image sensor 200 of the present embodiment, the work function of the formation material of the transfer gate 203 is arbitrarily selected, and hence, it may be possible to control the overflow operation for surplus electrons in the photodiode 11. In addition, at the time of the overflow operation, the overflow path for surplus electrons in the photodiode 11 is formed in the thickness direction of the semiconductor substrate 1 in the same way as in the first embodiment. Therefore, also in the CMOS image sensor 200 of the present embodiment, it may be possible to obtain the same advantageous effect as that of the first embodiment.

3. Third Embodiment

In a third embodiment, an example of a configuration will be described where the structure of the transfer gate is changed in the above-mentioned CMOS image sensor 100 of the first embodiment.

Figure 14:
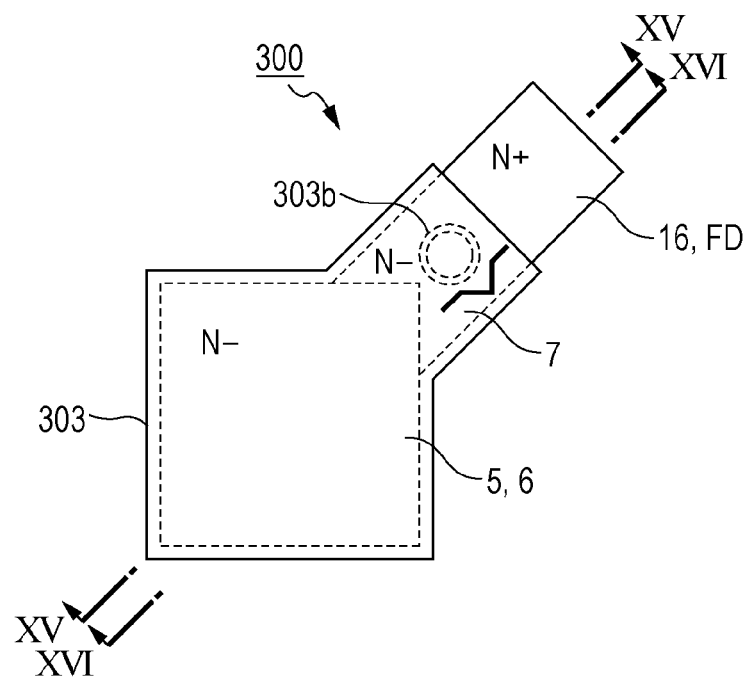
FIG. 14 is a schematic plan view in the vicinity of a photodiode in a solid-state imaging device according to a third embodiment.

FIGS. 14 to 16 illustrate the inner structure of a pixel in a CMOS image sensor of the present embodiment. In addition, FIG. 14 is a schematic plan view illustrating a disposition relationship among a photodiode, a transfer transistor, and a floating diffusion region. In addition, FIGS. 15 and 16 are diagrams illustrating a XV-XV cross-section and a XVI-XVI cross-section in FIG. 14, respectively, and both thereof are schematic configuration cross-sectional views in the vicinity of the photodiode.

In addition, in FIGS. 14 to 16, for the sake of providing a brief description, a main part is only illustrated that relates to a discharge operation for surplus electrons in the photodiode. The other inner structure may be configured in the same way as the back-side illumination type CMOS image sensor of related art. In addition, in a CMOS image sensor 300 in the present embodiment illustrated in FIGS. 14 to 16, the same configuration as the configuration of the CMOS image sensor 100 in the first embodiment illustrated in FIGS. 3 and 4 will be illustrated with a same symbol being assigned thereto.

The CMOS image sensor 300 of the present embodiment includes a semiconductor substrate 301, a gate insulation film 302 formed in a predetermined region in the substrate surface 301a of the semiconductor substrate 301, and a transfer gate 303 (TG) of the transfer transistor 12, formed on the gate insulation film 302. In addition, various kinds of circuits (various kinds of transistors) around the photodiode 11 and the whole configuration of the CMOS image sensor 300 have the same configurations as those of the first embodiment (refer to FIG. 1 and FIG. 2).

For example, the semiconductor substrate 301 is formed using an N type Si substrate, and includes the P well 4 and the N layer 5, the P layer 6, the surface N layer 7, and the floating diffusion region 16, formed so as to be embedded in the P well 4. In addition, the configurations (for example, impurity concentrations, thicknesses, and the like) of the P well 4, the N layer 5, the P layer 6, the surface N layer 7, and the floating diffusion region 16 may be form in the same way as those of the first embodiment corresponding thereto.

In addition, in the semiconductor substrate 301 of the present embodiment, as illustrated in FIG. 15, in a portion in the region of the surface N layer 7, located between the photodiode 11 and the floating diffusion region 16, a vertical hole 301c is formed that extends from the substrate surface 301a to a predetermined depth position in the thickness direction of the semiconductor substrate 301. In addition, in the example illustrated in FIG. 15, the vertical hole 301c is formed so as to extend to the vicinity of the bottom portion of the N layer 5 (the vicinity of a surface on a substrate back surface 301b side).

The gate insulation film 302 is formed on the surface of the surface N layer 7 and the wall surface of the semiconductor substrate 301, the wall surface defining the vertical hole 301c. In addition, in the same way as in the first embodiment, the gate insulation film 302 is formed using an insulation film such as an $SiO_2$ film or the like, for example.

The transfer gate 303 is formed on the gate insulation film 302 so as to be in contact therewith, and configured using a top surface gate electrode portion 303a formed above the substrate surface 301a and a columnar vertical gate electrode portion 303b embedded in the vertical hole 301c. In addition, in the same way as in the first embodiment, the transfer gate 303 may be formed using arbitrary conductive material, and may be formed using material such as polysilicon or the like, doped with an impurity, for example.

In addition, while, in the present embodiment, as illustrated in FIGS. 14 to 16, a configuration is illustrated where the circumference of the vertical gate electrode portion 303b is covered by the surface N layer 7 and the P well 4, an embodiment of the present disclosure is not limited to this example. For example, a configuration may be adopted where the circumference of the vertical gate electrode portion 303b is covered by the surface N layer 7.

In the CMOS image sensor 300 of the present embodiment, in the same way as in the first embodiment, the gate voltage VTG applied to the transfer gate 303 during the electron accumulation time period (photoelectric conversion time period) of the photodiode 11 is arbitrarily adjusted, and hence, an overflow operation is performed.

Specifically, during the electron accumulation time period of the photodiode 11, the positive bias voltage VM is applied to the transfer gate 303, the positive bias voltage VM lying between the high-level voltage VH causing the overflow barrier of the P layer 6 to disappear and the low-level voltage VL putting the overflow barrier into a non-conduction state. More specifically, for example, during the electron accumulation time period (photoelectric conversion time period) of the photodiode 11, the bias voltage VM in the range of 0<VM<Vdd is applied to the transfer gate 303.

In this case, since the upper portion of the photodiode 11 is covered by the top surface gate electrode portion 303a, the potential barrier of the surface N layer 7 with respect to an electron becomes lower than the overflow barrier of the P layer 6. As a result, during the electron accumulation time period (photoelectric conversion time period) of the photodiode 11, surplus electrons in the photodiode 11 are discharged to the floating diffusion region 16 through the P layer 6 and the surface N layer 7.

As described above, also in the CMOS image sensor 300 of the present embodiment, in the same way as in the first embodiment, it may be possible to discharge surplus electrons in the photodiode 11 to the outside of the pixel during the photoelectric conversion time period. In addition, at this time, in the same way as in the first embodiment, the overflow path for surplus electrons in the photodiode 11 is formed in the thickness direction of the semiconductor substrate 301. Therefore, when the transfer gate 303 is configured using a vertical transfer gate in the same way as in the CMOS image sensor 300 of the present embodiment, it may also be possible to obtain the same advantageous effect as that in the first embodiment.

In addition, in the present embodiment, since the vertical gate electrode portion 303b is provided in the transfer gate 303, when signal charge within the photodiode 11 is completely transferred to the floating diffusion region 16, a transfer channel is formed in the extending direction of the vertical gate electrode portion 303b. Namely, in the present embodiment, when the signal charge within the photodiode 11 is completely transferred to the floating diffusion region 16, it may be possible to transfer the signal charge in the thickness direction of the semiconductor substrate 1. Therefore, in the present embodiment, even if the miniaturization of a pixel has been promoted, it may be possible to improve the saturated charge amount or the sensitivity of the photodiode 11, and it may be possible to improve the transfer efficiency of the signal charge.

4. Fourth Embodiment

While, in the first to third embodiments, an example has been described where surplus electrons in the photodiode is discharged to the floating diffusion region, an embodiment of the present disclosure is not limited to this example, and a discharge region for surplus electrons may be provided in a region different from the floating diffusion region. In a fourth embodiment, an example of the configuration thereof will be described.

Figure 17:
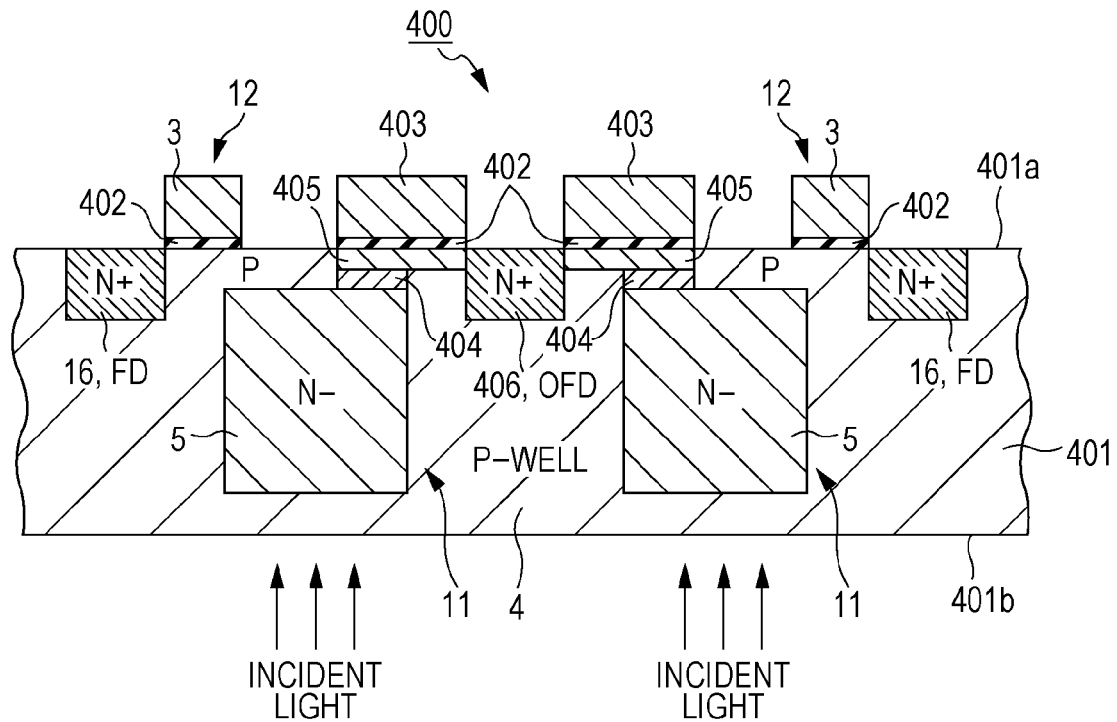
FIG. 17 is a schematic configuration cross-sectional view in the vicinity of a photodiode in a solid-state imaging device according to a fourth embodiment.
Figure 18:
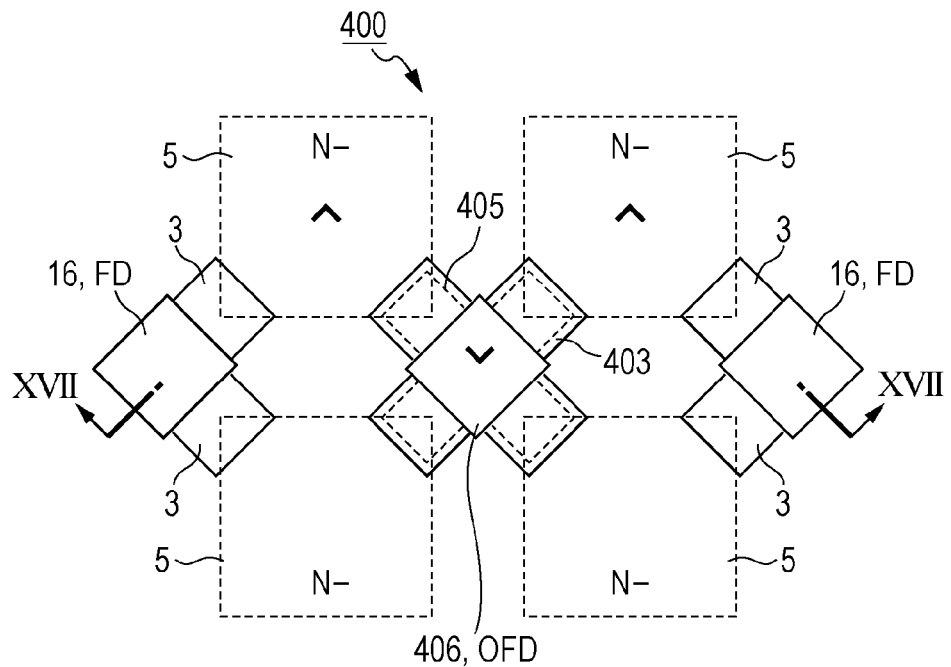
FIG. 18 is a schematic plan view in the vicinity of a photodiode in the solid-state imaging device according of the fourth embodiment.
Figure 19:
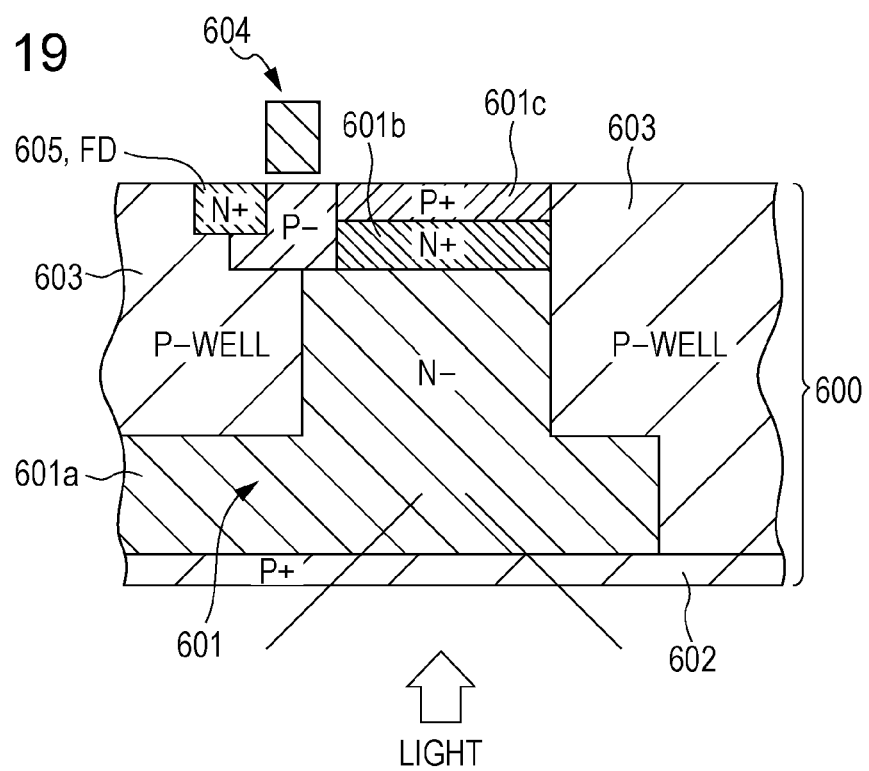
FIG. 19 is a schematic configuration cross-sectional view in the vicinity of a photodiode in a back-side illumination type solid-state imaging device of related art.
Figure 20:
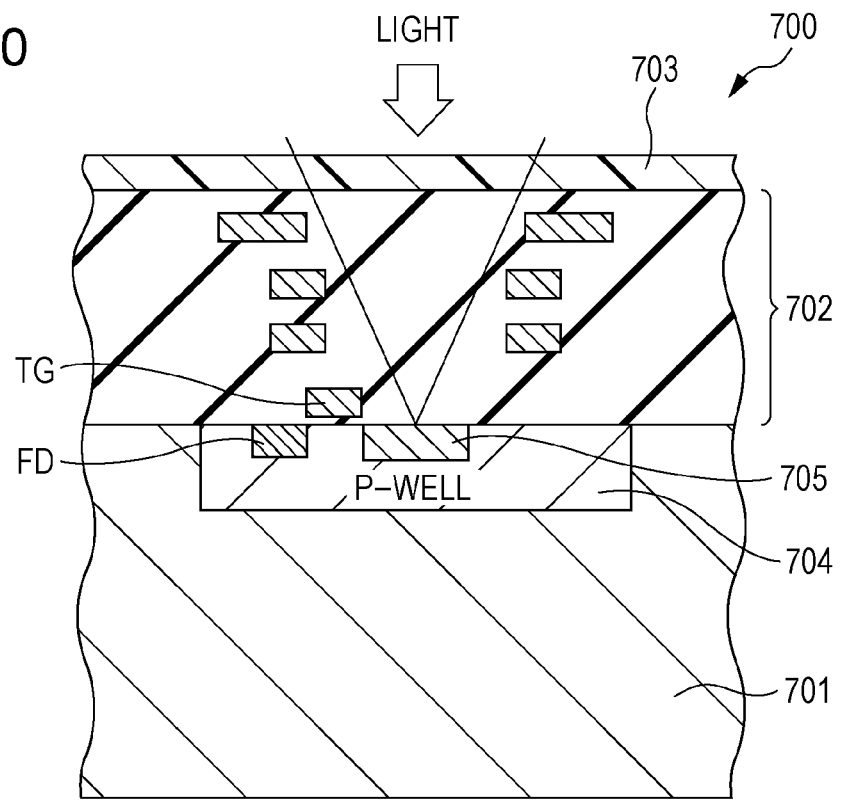
FIG. 20 is a schematic configuration cross-sectional view in the vicinity of a photodiode in a front-side illumination type solid-state imaging device of related art.

FIG. 17 and FIG. 18 illustrate a schematic configuration in the vicinity of a photodiode in a CMOS image sensor of the present embodiment. FIG. 17 is a schematic configuration cross-sectional view in the vicinity of the photodiode, and FIG. 18 is a schematic plan view illustrating a disposition relationship between the photodiode and an overflow drain. In this regard, however, FIG. 17 corresponds to a XVII-XVII cross-section in FIG. 18.

In addition, in FIGS. 17 and 18, for the sake of providing a brief description, a main part is only illustrated that relates to a discharge operation (overflow operation) for surplus electrons in the photodiode. The other inner structure may be configured in the same way as the back-side illumination type CMOS image sensor of related art. Furthermore, in a CMOS image sensor 400 in the present embodiment illustrated in FIGS. 17 and 18, the same configuration as the configuration of the CMOS image sensor 100 in the first embodiment illustrated in FIGS. 3 and 4 will be illustrated with a same symbol being assigned thereto.

The CMOS image sensor 400 of the present embodiment includes a semiconductor substrate 401 and a gate insulation film 402 formed in a predetermined region in the substrate surface 401a of the semiconductor substrate 401. Furthermore, the CMOS image sensor 400 includes the transfer gate 3 (TG) of the transfer transistor 12 and a control gate 403 (CG), formed on the gate insulation film 402. In addition, since the transfer gate 3 may be configured in the same way as that in the first embodiment, the description of the configuration thereof will be omitted here.

For example, the semiconductor substrate 401 is formed using an N type Si substrate, and includes the P well 4 and the N layer 5, the floating diffusion region 16, a P layer 404, a surface N layer 405, and an overflow drain 406 (OFD), formed so as to be embedded in the P well 4.

In addition, the N layer 5 of the photodiode and the floating diffusion region 16 may be formed in the same way as those of the first embodiment corresponding thereto.

The P layer 404 is formed so as to be in contact with a portion of a surface on the substrate surface 401a side of the N layer 5. In the present embodiment, the P layer 404 functions as an overflow barrier for surplus electrons in the photodiode 11. In addition, in the same way as the P layer 6 in the first embodiment, the impurity concentration of the P layer 404 may be about $1 \times 10^{17}$ cm$^{-3}$ to $1 \times 10^{18}$ cm$^{-3}$, for example.

The surface N layer 405 may be configured in the same way as the surface N layer 7 in the first embodiment. Namely, the surface N layer 405 is formed on a surface on the substrate surface 401a side of the P layer 404 so as to be in contact therewith, and formed so that a surface on the substrate surface 401a side of the surface N layer 405 is exposed on the substrate surface 401a. In addition, the N type impurity concentration of the surface N layer 405 may also be about $1 \times 10^{17}$ cm$^{-3}$ to $1 \times 10^{18}$ cm$^{-3}$, for example, and the depth of the surface N layer 405 may also be about 10 to 50 nm, for example.

In this regard, however, in the present embodiment, as illustrated in FIGS. 17 and 18, the surface N layer 405 is formed on the region of the P layer 404 and a region of the P well 4, the region of the P well 4 being located between the photodiode 11 and the overflow drain 406. Namely, in the present embodiment, the surface N layer 405 to be the discharge destination of surplus electrons in the photodiode 11 is connected to the overflow drain 406.

The overflow drain 406 is formed using an impurity layer whose carrier polarity is an N type, and the impurity concentration thereof may be about $1 \times 10^{20}$ cm$^{-3}$, for example. In addition, while not illustrated in FIGS. 17 and 18, the overflow drain 406 is connected to the supply terminal of the power source voltage Vdd through a contact.

Furthermore, in the present embodiment, the overflow drain 406 is formed in a separation portion (separation region) located between adjacent pixels and the overflow drain 406 is shared between the adjacent pixels. In FIGS. 17 and 18, an example is illustrated where, in a separation region located with being approximately equidistant from four pixels (the N layers 5 or the photodiodes 11) adjacent to one another in a two-dimensional direction, the overflow drain 406 is formed and one overflow drain 406 is shared among the corresponding four pixels. In addition, an embodiment of the present disclosure is not limited to this example, and one overflow drain 406 may be provided with respect to each pixel. In this regard, however, in terms of the miniaturization or the like of the CMOS image sensor 400, it is desirable that one overflow drain 406 is shared among a plurality of pixels in the same way as in the present embodiment.

The gate insulation film 402 is formed on the region of the surface N layer 405 and the channel portion of the transfer transistor 12. In addition, in the same way as the gate insulation film 2 in the first embodiment, the gate insulation film 402 is formed using an insulation film such as an SiO$_2$ film or the like, for example.

The control gate 403 is formed on the gate insulation film 402 formed in the region of the surface N layer 405, so as to be in contact with the gate insulation film 402. Namely, the control gate 403 is formed so as to cover the region of the surface N layer 405 through the gate insulation film 402. In addition, in the same way as the transfer gate 3, the control gate 403 may be formed using arbitrary conductive material, and may be formed using material such as polysilicon or the like, doped with an impurity, for example. In addition, in the same way as the transfer gate 3, the thickness of the transfer gate 403 may be about 100 to 300 nm.

In the CMOS image sensor 400 of the present embodiment having the above-mentioned configuration, in the same way as in the first embodiment, the gate voltage VTG applied to the transfer gate 403 during the electron accumulation time period (photoelectric conversion time period) of the photodiode 11 is arbitrarily adjusted, and hence, an overflow operation is performed.

Specifically, during the electron accumulation time period of the photodiode 11, the positive bias voltage VM is applied to the transfer gate 403, the positive bias voltage VM lying between the high-level voltage VH causing the overflow barrier of the P layer 404 to disappear and the low-level voltage VL putting the P layer 404 into a non-conduction state. More specifically, for example, during the electron accumulation time period (photoelectric conversion time period) of the photodiode 11, the bias voltage VM in the range of 0<VM<Vdd is applied to the transfer gate 403.

In this case, since the surface N layer 405 formed in the upper portion of the photodiode 11 is covered by the control gate 403, the potential barrier of the surface N layer 405 becomes lower than the overflow barrier of the P layer 404. As a result, during the electron accumulation time period of the photodiode 11, surplus electrons in the photodiode 11 are discharged to the overflow drain 406 through the P layer 404 and the surface N layer 405. In addition, a voltage signal applied to the control gate 403 at the time of this overflow operation is supplied from the vertical driving unit 102 (refer to FIG. 1) of the CMOS image sensor 400, for example.

As described above, also in the CMOS image sensor 400 of the present embodiment, in the same way as in the first embodiment, it may be possible to discharge surplus electrons in the photodiode 11 to the outside of the pixel during the photoelectric conversion time period. In addition, at this time, in the same way as in the first embodiment, the overflow path for surplus electrons in the photodiode 11 is formed in the thickness direction of the semiconductor substrate 401. Therefore, in the CMOS image sensor 400 of the present embodiment, it may also be possible to obtain the same advantageous effect as that in the first embodiment.

5. Various Examples of Modification

Next, examples of a modification to the CMOS image sensors of the above-mentioned various kinds of embodiments will be described.

First Example of Modification

While, in the third and fourth embodiments, examples have been described where, during the electron accumulation time period of the photodiode, the potential barrier of the surface N layer is controlled on the basis of the voltage applied to the transfer gate or the control gate, an embodiment of the present disclosure is not limited to these examples. For example, the configuration of the second embodiment may be applied to each of the configurations of the third and fourth embodiments.

Namely, in each of the configurations of the third and fourth embodiments, the transfer gate or the control gate may be formed using conductive material having a work function (less than or equal to 4.6 eV, more preferably, less than or equal to 4.3 eV) smaller than the work function of the semiconductor substrate (N type Si substrate). In this case, it may also be possible to obtain the same advantageous effect as each of those of the above-mentioned various kinds of embodiments.

Second Example of Modification

While, in the first to third embodiments, examples have been described where the potential barrier of the surface N layer is controlled by the transfer gate, an embodiment of the present disclosure is not limited to these examples. A control gate used for controlling the potential barrier of the surface N layer may be provided in conjunction with the transfer gate, and the potential barrier of the surface N layer may be controlled using both of the control gate and the transfer gate. In this case, for example, in the substrate surface of the semiconductor substrate, the transfer gate may be formed above the channel portion located between the photodiode and the floating diffusion region, and the control gate may be formed so as to cover the N layer (or P layer) of the photodiode.

For example, when the configuration of this example is applied to the first or third embodiment, both of voltages applied to the transfer gate and the control gate during the electron accumulation time period of the photodiode are set to the positive bias voltage VM (for example, 0<VM<Vdd), thereby controlling the overflow operation.

In addition, when the configuration of this example is applied to, for example, the second embodiment, both of the transfer gate and the control gate are formed using conductive material having a work function (less than or equal to 4.6 eV, more preferably, less than or equal to 4.3 eV) smaller than the work function of the semiconductor substrate (N type Si substrate). In addition, during the electron accumulation time period of the photodiode, it may be possible to control the overflow operation by applying the ground voltage to both of the transfer gate and the control gate.

By adopting such a configuration as described above, it may be possible to form an overflow path within a pixel in the same way as in the above-mentioned various kinds of embodiments, and it may be possible to obtain the same advantageous effect as each of those of the above-mentioned various kinds of embodiments. In addition, the configuration of this example is suitable not only to the discharge operation of surplus electrons, but also to an intended use where it is necessary to individually and delicately control various kinds of operations such as the pinning effect of the photodiode, the complete transfer operation of the signal charge, and the like, for example.

Third Example of Modification

While, in each of the above-mentioned various kinds of embodiments, an example has been described where the surface N layer is formed so as to cover the whole surface on the substrate surface side of the P layer formed on the N layer of the photodiode, an embodiment of the present disclosure is not limited to this example. If the surface N layer is connected to the floating diffusion region or the overflow drain, which is to be the transfer destination of the surplus electrons, the surface N layer may be formed so as to cover a portion of the surface of the P layer.

Also in this case, at the time of the overflow operation, it may be possible to form the overflow path in the thickness direction of the semiconductor substrate in the same way as in the above-mentioned various kinds of embodiments, and eventually it may be possible to discharge surplus electrons to the floating diffusion region or the overflow drain through the overflow path. Therefore, in the configuration of this example, it may also be possible to obtain the same advantageous effect as each of those of the above-mentioned various kinds of embodiments.

Fourth Example of Modification

In the CMOS image sensor of each of the above-mentioned various kinds of embodiments, the conductivity types (N types or P types) of various kinds of layers and various kinds of regions within the semiconductor substrate may be inverted. Specifically, while, in the CMOS image sensor of each of the above-mentioned various kinds of embodiments, an example has been described where signal charge corresponds to electrons, the photodiode may be formed within an N type semiconductor substrate using a P type impurity layer and positive holes may be used as the signal charge. In addition, when, in the above-mentioned fourth embodiment (refer to FIGS. 17 and 18), the conductivity types (N types or P types) of various kinds of layers and various kinds of regions within the semiconductor substrate are inverted, the overflow drain 406 is connected to a terminal for the ground voltage (0 V).

In this way, even if the conductivity types (N types or P types) of various kinds of layers and various kinds of regions within the semiconductor substrate are inverted, the discharge technique for surplus electric charge in the photodiode in each of the above-mentioned various kinds of embodiments may be applicable in the same way, and it may be possible to obtain the same advantageous effect as each of those of the above-mentioned various kinds of embodiments.

Fifth Example of Modification

While, in each of the above-mentioned various kinds of embodiments, an example has been described where the discharge technique for surplus electric charge in the photodiode of an embodiment of the present disclosure is applied to the back-side illumination type CMOS image sensor, an embodiment of the present disclosure is not limited to this example. The discharge technique for surplus electric charge in the photodiode of an embodiment of the present disclosure may be applicable to a front-side illumination type CMOS image sensor.

In this case, two overflow paths, namely, a path through an N type silicon substrate and a path through a P layer and a surface N layer in a thickness direction, are formed within a pixel. Therefore, also in this case, it may be possible to more reliably discharge the surplus electric charge of a photodiode and it may be possible to further suppress the occurrence of blooming, color mixture, or the like, for example. In addition, in this case, it is desirable that the transfer gate is formed using a transparent electrode of Indium Tin Oxide (ITO) or the like, for example.

Sixth Example of Modification

While, in each of the above-mentioned various kinds of embodiments, as an example, the CMOS image sensor has been cited and described where a plurality of pixels are two-dimensionally disposed in a matrix manner, an embodiment of the present disclosure is not limited to this example. The discharge technique for surplus electric charge in the photodiode in each of the above-mentioned various kinds of embodiments may be applicable, for example, to general solid-state imaging devices of column methods in each of which a column processing unit is disposed with respect to each column of a pixel array unit, and it may be possible to obtain the same advantageous effect as each of those of the above-mentioned various kinds of embodiments.

Seventh Example of Modification

The discharge technique for surplus electric charge in the photodiode in each of the above-mentioned various kinds of embodiments may be applicable not only to solid-state imaging devices where the distribution of the incident light amount of visible light is detected and an image is captured, but also to a solid-state imaging device detecting a light beam in another wavelength region.

For example, the discharge technique for surplus electric charge in each of the above-mentioned various kinds of embodiments may also be applicable to solid-state imaging devices where the distribution of the incident amount of infrared light, an X-ray, particles, or the like is captured as an image. Furthermore, in a broad sense, the discharge technique for surplus electric charge in each of the above-mentioned various kinds of embodiments may also be applicable to solid-state imaging devices (devices for detecting physical quantity distributions) such as a fingerprint detecting sensor and the like where the distribution of other physical quantity such as pressure, capacitance, or the like is detected and the distribution thereof is captured as an image.

In addition, an embodiment of the present disclosure may also include the following configurations.

(1) A solid-state imaging device including
a substrate,
a photoelectric conversion portion configured to be provided within the substrate, include a first impurity layer whose carrier polarity is a first conductivity type, and photoelectric-convert incident light into signal charge,
an impurity region portion configured to be provided within the substrate wherein a carrier polarity of the impurity region portion is the first conductivity type,
a second impurity layer configured to be formed on a surface of the first impurity layer so as to be in contact with the surface of the first impurity layer, which is located on one surface side of the substrate, wherein a carrier polarity of the second impurity layer is a second conductivity type opposite to the first conductivity type,
a third impurity layer configured to be formed on the second impurity layer so as to be in contact therewith and connected to the impurity region portion wherein a carrier polarity of the third impurity layer is the first conductivity type, and
a gate electrode configured to be formed above the third impurity layer so as to cover the third impurity layer.

(2) The solid-state imaging device according to (1), wherein
when it is assumed that a voltage applied to the gate electrode when a conduction state is caused to occur between the photoelectric conversion portion and the impurity region portion is a first voltage and a voltage applied to the gate electrode when a non-conduction state is caused to occur between the photoelectric conversion portion and the impurity region portion is a second voltage, a third voltage smaller than the first voltage and larger than the second voltage is applied to the gate electrode during a photoelectric conversion time period of the photoelectric conversion portion.

(3) The solid-state imaging device according to (1), wherein
a work function of the gate electrode is less than or equal to 4.6 eV.

(4) The solid-state imaging device according to any one of (1) to (3), further including
a floating diffusion region portion configured to convert, to a voltage, the signal charge generated in the photoelectric conversion portion, and
a transfer transistor configured to transfer the signal charge generated in the photoelectric conversion portion to the floating diffusion region portion, wherein
the impurity region portion is the floating diffusion region portion, and
the gate electrode is a transfer gate of the transfer transistor.

(5) The solid-state imaging device according to (4), wherein
the gate electrode includes a vertical gate electrode portion extending in a thickness direction of the substrate, and
the vertical gate electrode portion is formed in a portion of a region between the photoelectric conversion portion and the impurity region portion.

(6) The solid-state imaging device according to any one of (1) to (3), further including
a plurality of pixels each of which is configured to include the photoelectric conversion portion, the second impurity layer, the third impurity layer, and the gate electrode, wherein
the impurity region portion is formed in a separation region between pixels adjacent to each other and shared between the pixels adjacent to each other.

(7) The solid-state imaging device according to any one of (1) to (6), wherein
the photoelectric conversion portion is subjected to light from the other surface side of the substrate.

(8) The solid-state imaging device according to any one of (1) to (7), wherein
the first conductivity type is an N type, and the
second conductivity type is a P type.

(9) An electronic device including
a solid-state imaging device including a substrate, a photoelectric conversion portion configured to be provided within the substrate, include a first impurity layer whose carrier polarity is a first conductivity type, and photoelectric-convert incident light into signal charge, an impurity region portion configured to be provided within the substrate wherein a carrier polarity of the impurity region portion is the first conductivity type, a second impurity layer configured to be formed on a surface of the first impurity layer so as to be in contact with the surface of the first impurity layer, which is located on one surface side of the substrate, wherein a carrier polarity of the second impurity layer is a second conductivity type opposite to the first conductivity type, a third impurity layer configured to be formed on the second impurity layer so as to be in contact therewith and connected to the impurity region portion wherein a carrier polarity of the third impurity layer is the first conductivity type, and a gate electrode configured to be formed above the third impurity layer so as to cover the third impurity layer, and
a signal processing circuit configured to perform predetermined processing on an output signal from the solid-state imaging device.

(10) A manufacturing method for a solid-state imaging device, including
forming, within a substrate, a photoelectric conversion portion configured to include a first impurity layer whose carrier polarity is a first conductivity type and photoelectric-convert incident light into signal charge,
forming a second impurity layer, whose carrier polarity is a second conductivity type opposite to the first conductivity type, on a surface of the first impurity layer so that the second impurity layer is in contact with the surface of the first impurity layer, which is located on one surface side of the substrate, forming a third impurity layer, whose carrier polarity is the first conductivity type, on the second impurity layer so that the third impurity layer is in contact therewith, forming a gate electrode above the third impurity layer so that the gate electrode covers the third impurity layer, and forming an impurity region portion, whose carrier polarity is the first conductivity type, within the substrate so that the impurity region portion is connected to the third impurity layer.

The present disclosure contains subject matter related to that disclosed in Japanese Priority Patent Application JP 2011-148882 filed in the Japan Patent Office on Jul. 5, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising: a substrate; a photoelectric conversion portion configured to be provided within the substrate, include a first impurity layer whose carrier polarity is a first conductivity type, and photoelectric-convert incident light into signal charge; an impurity region portion configured to be provided within the substrate wherein a carrier polarity of the impurity region portion is the first conductivity type; a second impurity layer configured to be formed on a surface of the first impurity layer so as to be in contact with the surface of the first impurity layer, which is located on one surface side of the substrate, wherein a carrier polarity of the second impurity layer is a second conductivity type opposite to the first conductivity type; a third impurity layer configured to be formed on the second impurity layer so as to be in contact therewith and connected to the impurity region portion wherein a carrier polarity of the third impurity layer is the first conductivity type; and a gate electrode configured to be formed above the third impurity layer, wherein a length the gate electrode parallel to the substrate is at least as long as a length of the third impurity region parallel to the substrate.

2. The solid-state imaging device according to claim 1, wherein when it is assumed that a voltage applied to the gate electrode when a conduction state is caused to occur between the photoelectric conversion portion and the impurity region portion is a first voltage and a voltage applied to the gate electrode when a non-conduction state is caused to occur between the photoelectric conversion portion and the impurity region portion is a second voltage, a third voltage smaller than the first voltage and larger than the second voltage is applied to the gate electrode during a photoelectric conversion time period of the photoelectric conversion portion.

3. The solid-state imaging device according to claim 2, further comprising: a floating diffusion region portion configured to convert, to a voltage, the signal charge generated in the photoelectric conversion portion; and a transfer transistor configured to transfer the signal charge generated in the photoelectric conversion portion to the floating diffusion region portion, wherein the impurity region portion is the floating diffusion region portion, and the gate electrode is a transfer gate of the transfer transistor.

4. The solid-state imaging device according to claim 3, wherein the gate electrode includes a vertical gate electrode portion extending in a thickness direction of the substrate, and the vertical gate electrode portion is formed in a portion of a region between the photoelectric conversion portion and the impurity region portion.

5. The solid-state imaging device according to claim 2, further comprising: a plurality of pixels each of which is configured to include the photoelectric conversion portion, the second impurity layer, the third impurity layer, and the gate electrode, wherein the impurity region portion is formed in a separation region between pixels adjacent to each other and shared between the pixels adjacent to each other.

6. The solid-state imaging device according to claim 1, wherein a work function of the gate electrode is less than or equal to 4.6 eV.

7. The solid-state imaging device according to claim 1, wherein the photoelectric conversion portion is subjected to light from the other surface side of the substrate.

8. The solid-state imaging device according to claim 1, wherein the first conductivity type is an N type, and the second conductivity type is a P type.

9. An electronic device comprising: a solid-state imaging device including a substrate, a photoelectric conversion portion configured to be provided within the substrate, include a first impurity layer whose carrier polarity is a first conductivity type, and photoelectric-convert incident light into signal charge, an impurity region portion configured to be provided within the substrate wherein a carrier polarity of the impurity region portion is the first conductivity type, a second impurity layer configured to be formed on a surface of the first impurity layer so as to be in contact with the surface of the first impurity layer, which is located on one surface side of the substrate, wherein a carrier polarity of the second impurity layer is a second conductivity type opposite to the first conductivity type, a third impurity layer configured to be formed on the second impurity layer so as to be in contact therewith and connected to the impurity region portion wherein a carrier polarity of the third impurity layer is the first conductivity type, and a gate electrode configured to be formed above the third impurity layer, wherein a length of the gate electrode parallel to the substrate is at least as long as a length of the third impurity region parallel to the substrate; and a signal processing circuit configured to perform predetermined processing on an output signal from the solid-state imaging device.

* * * * *